(12) United States Patent
Bernard

(10) Patent No.: US 10,247,777 B1
(45) Date of Patent: Apr. 2, 2019

(54) DETECTING AND LOCATING SHOOT-THROUGH TIMING FAILURES IN A SEMICONDUCTOR INTEGRATED CIRCUIT

(71) Applicant: TESEDA CORPORATION, Portland, OR (US)

(72) Inventor: Theodore Clifton Bernard, San Ramon, CA (US)

(73) Assignee: TESEDA CORPORATION, Portland, OR (US)

( * ) Notice: Subject to any disclaimer, the term of this patent is extended or adjusted under 35 U.S.C. 154(b) by 0 days.

(21) Appl. No.: 15/810,607

(22) Filed: Nov. 13, 2017

Related U.S. Application Data

(60) Provisional application No. 62/420,092, filed on Nov. 10, 2016.

(51) Int. Cl.
G01R 31/28 (2006.01)
G01R 31/3177 (2006.01)
G01R 31/317 (2006.01)

(52) U.S. Cl.
CPC ... *G01R 31/3177* (2013.01); *G01R 31/31703* (2013.01); *G01R 31/31725* (2013.01)

(58) Field of Classification Search
None
See application file for complete search history.

(56) References Cited

U.S. PATENT DOCUMENTS

| | | | |
|---|---|---|---|
| 5,920,575 A * | 7/1999 | Gregor | G01R 31/318541 714/726 |
| 6,185,707 B1 | 2/2001 | Smith | |
| 6,832,122 B1 | 12/2004 | Huber | |
| 7,729,884 B2 | 6/2010 | Huang | |
| 7,843,218 B1 * | 11/2010 | Ramaraju | G01R 31/318541 326/38 |
| 8,332,698 B2 * | 12/2012 | Tang | G01R 31/318594 714/726 |
| 8,412,991 B2 | 4/2013 | Ackerman | |
| 8,453,088 B2 | 5/2013 | Akar | |
| 8,539,389 B2 | 9/2013 | Akar | |

(Continued)

OTHER PUBLICATIONS

Stolowitz Ford Cowger LLP; Related Case Listing; Portland, OR; Jul. 1, 2014; 2 Pages.

(Continued)

*Primary Examiner* — Mujtaba M Chaudry
(74) *Attorney, Agent, or Firm* — FisherBroyles LLP; Micah D. Stolowitz

(57) ABSTRACT

"Shoot-through" timing failures in a scan chain of a defective semiconductor integrated circuit corrupt test pattern data used to perform failure analysis. Methods and procedures are provided to detect "shoot-through" conditions, determine the number of shoot-through scan cells, and to determine the location of the shoot-through cells within a scan chain. Reset test pattern results can be analyzed to identify candidate locations of shoot-through cells and when combined with candidate cell locations from analysis of physical clock distribution trees and potential clock-skew issues, the exact location of all shoot-through cells can be determined. Methods are also provided to use shoot-through cell locations to identify the defective clock net containing the physical defect causing the clock skew conditions needed to produce shoot-through timing failures.

4 Claims, 26 Drawing Sheets

(56) References Cited

U.S. PATENT DOCUMENTS

| | | |
|---|---|---|
| 8,560,904 B2 | 10/2013 | Ackerman |
| 8,626,460 B2 | 1/2014 | Kaufman |
| 2005/0066294 A1 | 3/2005 | Templeton |
| 2005/0225365 A1* | 10/2005 | Wood .................. G06F 1/12 327/141 |
| 2006/0053357 A1 | 3/2006 | Rajski |
| 2007/0011519 A1 | 1/2007 | Takeda |
| 2007/0016879 A1 | 1/2007 | Kuo |
| 2007/0143718 A1 | 6/2007 | Abercrombie |
| 2008/0091981 A1 | 4/2008 | Dokken |
| 2008/0284453 A1 | 11/2008 | Swenton |
| 2008/0307280 A1* | 12/2008 | Putman .......... G01R 31/318541 714/727 |
| 2010/0321042 A1* | 12/2010 | Agarwal ............... G01R 31/27 324/681 |
| 2010/0332172 A1 | 12/2010 | Kaufman |
| 2014/0115412 A1 | 4/2014 | Ackerman |
| 2014/0115551 A1 | 4/2014 | Akar |
| 2014/0204645 A1* | 7/2014 | Ohmaru ............... G11C 29/00 365/72 |
| 2015/0276874 A1* | 10/2015 | Morton ............ G01R 31/3177 714/727 |
| 2016/0105174 A1* | 4/2016 | Uesugi ............... H01L 27/1207 326/102 |

OTHER PUBLICATIONS

Kashyap, Chandramouli et al., "Silicon feedback to improve frequency of high-performance microprocessors—an overview"; Published in Proceedings ICCAD '08 Proceedings of the 2008 IEEE/ACM International Conference on Computer-Aided Design; 2008; 5 pages.

* cited by examiner

[1] Determine if shoot-thru condition exists and base shift amount

[2] Determine Number of Shoot-through Locations

Vector Table

| Setup | | |
|---|---|---|
| X "pattern 0" -- "pattern 212" | Test: "pattern 0" 722 ▼ ▲ ✕ | "pattern 0": Call "load_unload" ✕ Call "capture" ✕ "pattern 1": Call "load_unload" ▲ ✕ |

| Parameter Name | ScanChain | Parameter Value |
|---|---|---|
| X "scan_out0" | "1" 724 | HHLLHHLLHHLLHHLLH 726 |

| Chain Name | Cell Index | Cell Name | Unload (pin) |
|---|---|---|---|
| X "1" | 1264 | "chip_top.u_dig_top.dig_tip_core_0.sensors_0_vvms_edge1_dly_out_reg.D" | H |
| X "1" | 1265 | "chip_top.u_dig_top.dig_tip_core_0.sync_block_0_u_sync_filtered_vms_out_reg_0_.TD" | H |
| X "1" | 1266 | "chip_top.u_dig_top.dig_tip_core_0.control_equations_0_dither_gen_0_lfsr_reg_9_.D" | L |
| X "1" | 1267 | "chip_top.u_dig_top.dig_tip_core_0.control_equations_0_dither_gen_0_lfsr_reg_0_.TD" | L |
| X "1" | 1268 | "chip_top.u_dig_top.dig_tip_core_0.mmt_0_vfb_clamp_latch2_reg.D" | H |
| ... | ... | ... | ... |
| X "1" | 1290 | "chip_top.u_dig_top.dig_tip_core_0.sync_block_0_filter2_vsd_neg_edge_reg.TD" | L |
| X "1" | 1291 | "chip_top.u_dig_top.dig_tip_core_0.sync_block_0_filter2_vmin_neg_edge_reg.TD" | L |
| X "1" | 1292 | "chip_top.u_dig_top.dig_tip_core_0.sync_block_0_filter2_vnee_neg_edge_reg.TD" | H |
| X "1" | 1293 | "chip_top.u_dig_top.dig_tip_core_0.sync_block_0_filter2_vfb_neg_edge_reg.TD" | H |
| X "1" | 1294 | "chip_top.u_dig_top.dig_tip_core_0.sync_block_0_filter2_vfb2_neg_edge_reg.TD" | L |
| X "1" | 1295 | "chip_top.u_dig_top.dig_tip_core_0.sync_block_0_filter2_vvms_neg_edge_reg.TD" | L |
| X "1" | 1296 | "chip_top.u_dig_top.dig_tip_core_0.clk_sw_0.dk_mux_reg.TD" | H |

Signal/Scan View | Chain View

Scan Test View

Reset Test (Pattern 18) Last 10 cycles

[First] Cycle: [26,025] [Go To] [Last]   (Test: "pattern 19")

Run Results (Not Available): ● Actual ○ Expected   [X←] [→X] [☐]

| Tests | Padding | Edits | Results | Debug | DC PMU | IDDQ | Display |

|          | ..25 | ..26 | ..27 | ..28 | ..29 | ..30 | ..31 | ..32 | ..33 | ..34 ] | ..35 |
|---|---|---|---|---|---|---|---|---|---|---|---|
| "scan_clk"  | P | P | P | P | P | P | P | P | P | P | 0 |
| "scan_en"   | 1 | 1 | 1 | 1 | 1 | 1 | 1 | 1 | 1 | 1 | 1 |
| "scan_in0"  | 0 | 1 | 0 | 1 | 1 | 1 | 0 | 1 | 1 | 0 | 0 |
| ✗ "scan_out0" | H | L | H | H | H | L | H | H | H | H | L |
| "scan_rst"  | 0 | 0 | 0 | 0 | 0 | 0 | 0 | 0 | 0 | 0 | 0 |

Pattern #19 First 10 cycles

Test: "pattern 19"

"pattern 19": Call "load_unload"
✗ Call "capture_scan_clk"
✗ "pattern 20": Call "load_unload"

[←] [→]
[X←] [→X]

| ScanChain | Parameter Value |
|---|---|
| "1" | 0100001 00111001001111111 |

| Chain Name | Cell Index | Cell Name | Unload (pin) |
|---|---|---|---|
| ✗ "1" | 0 | (Cell Name) | 0 |
| ✗ "1" | 1 | (Cell Name) | 1 |
| ✗ "1" | 2 | (Cell Name) | 0 |
| ✗ "1" | 3 | (Cell Name) | 0 |
| ✗ "1" | 4 | (Cell Name) | 0 |
| ✗ "1" | 5 | (Cell Name) | 0 |
| ✗ "1" | 6 | (Cell Name) | 1 |
| ✗ "1" | 7 | (Cell Name) | 0 |

Determine # of Shoot-thrus_Pattern Analysis

Pattern 18 Reset

| Chain Name | Cell Index | Cell Name | Unload (pin) |
|---|---|---|---|
| "1" | 215 | "chip_top.u_dig_top.dig_tip_core_0.sensors_0_vfbdig1_block_gap_speed_up_cnt_reg_0_...." | H |
| "1" | 216 | "chip_top.u_dig_top.dig_tip_core_0.sensors_0_vfb_dig_small_reg.TD" | L |
| "1" | 217 | "chip_top.u_dig_top.dig_tip_core_0.sensors_0_sign_v_eer_d_d_reg.TD" | H |
| "1" | 218 | "chip_top.u_dig_top.dig_tip_core_0.sensors_0_second_det_latch_reg.TD" | L |
| "1" | 219 | "chip_top.u_dig_top.dig_tip_core_0.sensors_0_release_cnt_reg.TD" | L |
| X "1" | 220 | "chip_top.u_dig_top.dig_tip_core_0.sensors_0_ovp_cnt_vfb_reg_1_.TD" | L |
| X "1" | 221 | "chip_top.u_dig_top.dig_tip_core_0.sensors_0_ovp_cnt_vfb_reg_0_.TD" | H |
| "1" | 222 | "chip_top.u_dig_top.dig_tip_core_0.sensors_0_gap2_vfb_reg_gap_cnt_reg_4_.TD" | H |
| "1" | 223 | "chip_top.u_dig_top.dig_tip_core_0.sensors_0_gap2_vfb_reg_gap_cnt_reg_3_.TD" | L |
| "1" | 224 | "chip_top.u_dig_top.dig_tip_core_0.sensors_0_gap2_vfb_reg_gap_cnt_reg_2_.TD" | L |
| "1" | 225 | "chip_top.u_dig_top.dig_tip_core_0.sensors_0_gap2_vfb_reg_gap_cnt_reg_1_.TD" | L |
| "1" | 226 | "chip_top.u_dig_top.dig_tip_core_0.sensors_0_gap2_vfb_reg_gap_cnt_reg_0_.TD" | H |
| "1" | 227 | "chip_top.u_dig_top.dig_tip_core_0.sensors_0_gap2_vfb_gap_value_reg_4_.TD" | L |
| "1" | 228 | "chip_top.u_dig_top.dig_tip_core_0.sensors_0_gap2_vfb_gap_value_reg_3_.TD" | H |
| "1" | 229 | "chip_top.u_dig_top.dig_tip_core_0.sensors_0_gap2_vfb_gap_value_reg_2_.TD" | L |
| X "1" | 230 | "chip_top.u_dig_top.dig_tip_core_0.sensors_0_gap2_vfb_gap_value_reg_1_.TD" | H |
| X "1" | 231 | "chip_top.u_dig_top.dig_tip_core_0.sensors_0_gap2_vfb_gap_value_reg_0_.TD" | H |
| "1" | 232 | "chip_top.u_dig_top.dig_tip_core_0.sensors_0_gap2_vfb_gap_count_reg_4_.TD" | L |
| "1" | 233 | "chip_top.u_dig_top.dig_tip_core_0.sensors_0_gap2_vfb_gap_count_reg_3_.TD" | H |
| "1" | 234 | "chip_top.u_dig_top.dig_tip_core_0.sensors_0_gap2_vfb_gap_count_reg_2_.TD" | L |
| X "1" | 235 | "chip_top.u_dig_top.dig_tip_core_0.sensors_0_gap2_vfb_gap_count_reg_1_.TD" | H |
| X "1" | 236 | "chip_top.u_dig_top.dig_tip_core_0.sensors_0_gap2_vfb_gap_count_reg_0_.TD" | L |
| "1" | 237 | "chip_top.u_dig_top.dig_tip_core_0.sensors_0_gap2_vfb2_reg_gap_cnt_reg_5_.TD" | H |
| "1" | 238 | "chip_top.u_dig_top.dig_tip_core_0.sensors_0_gap2_vfb2_reg_gap_cnt_reg_4_.TD" | L |
| "1" | 239 | "chip_top.u_dig_top.dig_tip_core_0.sensors_0_gap2_vfb2_reg_gap_cnt_reg_3_.TD" | H |
| "1" | 240 | "chip_top.u_dig_top.dig_tip_core_0.sensors_0_gap2_vfb2_reg_gap_cnt_reg_2_.TD" | H |
| "1" | 241 | "chip_top.u_dig_top.dig_tip_core_0.sensors_0_gap2_vfb2_reg_gap_cnt_reg_1_.TD" | H |
| X "1" | 242 | "chip_top.u_dig_top.dig_tip_core_0.sensors_0_gap2_vfb2_reg_gap_cnt_reg_0_.TD" | H |
| "1" | 243 | "chip_top.u_dig_top.dig_tip_core_0.sensors_0_gap2_vfb2_gap_value_reg_5_.TD" | L |
| "1" | 244 | "chip_top.u_dig_top.dig_tip_core_0.sensors_0_gap2_vfb2_gap_value_reg_4_.TD" | H |

| | Cell # | Expect | Simulated Expect | Actual | Fail | Comment |
|---|---|---|---|---|---|---|
| 24951 | 213 | L | L | L | | |
| 24952 | 214 | L | L | L | | |
| 24953 | 215 | H | H | H | | |
| 24954 | 216 | L | L | L | | |
| 24955 | 217 | H | H | H | | |
| 24956 | 218 | L | | L | | 218 bit lost; jump forward; offset = 1 |
| 24957 | 219 | L | L | L | | |
| 24958 | 220 | L * | H | H | * | |
| 24959 | 221 | H * | L | L | * | 221 bit lost; jump forward; cumulative offset = 2 |
| 24960 | 222 | H | H | H | | |
| 24961 | 223 | L | L | L | | |
| 24962 | 224 | H | H | H | | |

FIG. 12

| | Cell # | Expect | Simulated Expect | Actual | Fail | Comment |
|---|---|---|---|---|---|---|
| 25041 | 303 | L * | L | H | | |
| 25042 | 304 | L * | H | H | * | |
| 25043 | 305 | H | H | H | | |
| 25044 | 306 | L * | H | H | * | 306 bit lost; jump forward; cumulative offset = 3 |
| 25045 | 307 | H * | L | L | * | |
| 25046 | 308 | H | H | H | | |

| | Cell # | Expect | Simulated Expect | Actual | Fail | Comment |
|---|---|---|---|---|---|---|
| 25267 | 529 | H * | L | L | * | |
| 25268 | 530 | L * | H | H | * | |
| 25269 | 531 | L * | H | H | * | |
| 25270 | 532 | L * | H | H | * | |
| 25271 | 533 | H * | H | H | | 533 bit lost; jump forward; cumulative offset = 4 |
| 25272 | 534 | H | H | H | | |
| 25273 | 535 | H | H | H | | |

| | Cell # | Expect | Simulated Expect | Actual | Fail | Comment |
|---|---|---|---|---|---|---|
| 25905 | 1167 | L | L | L | | |
| 25906 | 1168 | H * | L | L | * | |
| 25907 | 1169 | L | L | L | | |
| 25908 | 1170 | H | H | H | | |
| 25909 | 1171 | L * | H | H | * | |
| 20910 | 1172 | L * | H | H | * | 1172 bit lost; jump forward; cumulative offset = 5 |
| 25911 | 1173 | L * | H | H | * | |
| 25912 | 1174 | L * | H | H | * | |

FIG. 13

1 non-delayed branch off "clk_42" - no shoot-thru observed
3 delayed branches off "clk_42" with shoot-thru - upper net portion
Therefore defect must be on net segment below upper 3 delayed branches Non-Delayed Clock Branches

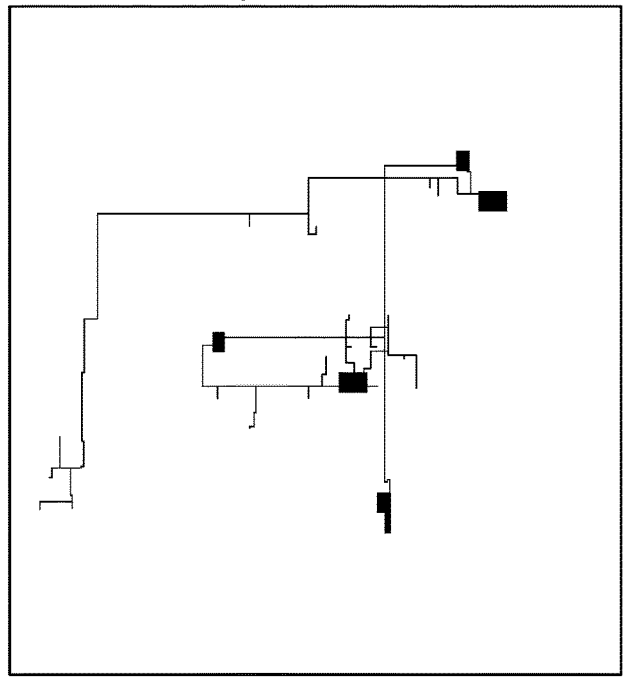

FIG. 15A 1 non-delayed branch off "clk_42" - no shoot-thru observed
3 delayed branches off "clk_42" with shoot-thru - upper net portion
Therefore defect must be on net segment below upper 3 delayed branches Clk_42

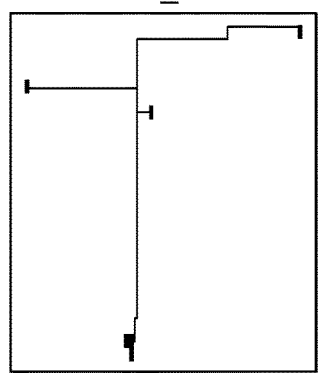

FIG. 15B 1 non-delayed branch off "clk_42" - no shoot-thru observed
3 delayed branches off "clk_42" with shoot-thru - upper net portion
Therefore defect must be on net segment below upper 3 delayed branches Delayed Clock Branches

DETERMINE LOCATIONS OF SHOOT-THROUGH CELLS

*Reset Pattern Analysis*

Identify all scan cells that cannot be reset/set during a reset pattern. Mark them to ignore in comparisons by changing their expected values to "X".
1602

Use reset pattern data to determine potential shoot-thru cell locations / candidates. Compare reset test actual values with expected values, and determine shift (offset) to match (excepting cells marked non-resettable).
1606

Each time the expected values must be shifted forward / offset to match the actual values, the offset increases and a candidate range is identified. A candidate range occurs when the expected value of the shoot-thru cell candidate matches the expected value of the previous cell(s).
1610

The range extends from the initial candidate location backwards including all cells with the same expected value. These ranges together define a first set of candidates or potential shoot-through locations.
1620

*Physical Clock Skew Analysis*

Analyze the physical clock tree branches and scan chain order to determine potential shoot-thru location candidates.
1622

Traverse the scan chain in the direction data is shifted through identifying potential clock skew issues between adjacent scan cells. If adjacent scan cells are on different physical clock branches, they have the potential for clock skew.
1624

If the cell's clock net is different than the previous cell's clock net in the chain, then the cell is a "delayed cell" candidate. The previous cell would be the "shoot-thru cell" candidate. If the cell's clock net is different than the next cell's clock net, then the cell is a "shoot-thru cell" candidate
1626

1632
Combine candidates from reset pattern analysis and physical clock-skew analysis. Final shoot-thru candidates are the intersection of the two candidate sets.

1634
Optional simulation of shoot-thru candidate locations to confirm analysis

FIG. 16A

Example Procedure to identify the defective clock net / buffer based on shoot-thru cell locations

DETECTING AND LOCATING SHOOT-THROUGH TIMING FAILURES IN A SEMICONDUCTOR INTEGRATED CIRCUIT

RELATED CASE

This application is a non-provisional of and claims priority to U.S. Provisional Application No. 62/420,092 filed Nov. 10, 2016 and incorporated herein by this reference.

COPYRIGHT NOTICE

© 2016-2017 Teseda Corporation. A portion of the disclosure of this embodiment document contains material, which is subject to copyright protection. A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR § 1.71(d).

TECHNICAL FIELD

This invention pertains to analyzing failures in packaged semiconductor integrated circuits (referred to as FA or failure analysis), and more specifically, to detecting and identifying shoot-through timing failures in a scan chain of an integrated circuit.

BACKGROUND

Scan chains are commonly designed into semiconductor integrated circuits (or "devices") for testing and analyzing performance of the circuits. Typically, scan chain comprises a series of flip-flop circuits arranged much like a shift register. A single input pin can be used to clock data into the scan chain and, conversely, a single output pin on the device can be used to clock data out of the scan chain.

In a typical circuit, there may be hundreds or even thousands of scan chains. The scan chains may be multiplexed to utilize a limited number of I/O pins. Further, each scan chain may comprise hundreds or even thousands of flip-flop circuits. Accordingly, detecting, identifying and physically locating a failure in a scan chain can be particularly challenging.

SUMMARY

The following is a summary of the present disclosure to provide a basic understanding of some aspects of the disclosure. The summary is not intended to identify key/critical elements of the disclosure or delineate the scope of the disclosure. Its sole purpose is to present some concepts of the disclosure in a simplified form as a prelude to the more detailed description that is presented later.

In some embodiments, systems and methods disclosed for detecting and locating shoot-through timing failures in a scan chain of a semiconductor integrated circuit. A timing failure here may refer to a condition in which clock delay or skew in the clock signal driving a flip-flop circuit of a scan chain causes it to "miss" the incoming data from the flip-flop circuit or "cell" next preceding the delayed cell, which we call a shoot-through cell. Typically, because of the delay, the data bit of a third cell, the one next preceding the shoot-through cell, "shoots through" the shoot-through cell and is clocked into the delayed cell. The shoot-through cell data bit is lost. Multiple shoot-through cells in a single scan chain result in often complex anomalies in scan test output data (results).

In some embodiments, the present disclosure programmatically determines a number of shoot-through locations in a scan chain. For example, the illustrative processes may be implemented in software. In some embodiments, some or all of the processes disclosed herein may be executed "off-line" by analyzing data acquired by a tester system. In some embodiments, the analysis software may be provided remotely as a service (SaaS).

In some embodiments, the present disclosure programmatically identifies each of the delayed cells in the scan chain. These processes also preferably are implemented in software like those in the prior paragraph. This information—the identified delayed cells, may be used to identity the individual clock net or buffer causing the delay, which in turn may be used for identifying and correcting a defect in the semiconductor design and/or fabrication process.

In some embodiments, determining the locations of shoot-through cells may include—
(a) applying reset pattern analysis to determine one or more candidate ranges, each candidate range extending from a corresponding initial candidate shoot-through cell, backwards in the scan chain, so as to include all cells with the same expected value as the initial candidate, the candidate ranges together defining a first set of potential shoot-through locations;
(b) applying physical clock skew analysis to identify scan cells that have a potential for clock skew relative to their adjacent scan cells where adjacent cells of the scan chain are on different physical clock branches or nets, the scan cells identified by the physical clock skew analysis defining a second set of potential shoot-through locations; and
(c) determining a final set of shoot-through candidates as an intersection of the first and second sets of potential shoot-through locations.

Additional aspects and advantages of this disclosure will be apparent from the following detailed description, which proceeds with reference to the accompanying drawings.

BRIEF DESCRIPTIONS OF THE DRAWINGS

FIG. 7B illustrates an example of flush pattern scan test view, showing multiple failed cells. This has pattern 0 (flush test) results and expected unload values with pipelined pattern 1.

FIG. 9 illustrates further confirmation of the flush test pattern analysis conclusions of exactly 6 shoot-thru locations using a reset test (Pattern #18).

FIG. 10 is a truncated illustration of a screen display of scan chain test results and expected unload values to illustrate an example of a reset pattern analysis to help identify shoot-thru location candidates based on pattern offsets.

FIG. 12 is a tabular data display applying simulated expected results applied to selected candidate shoot-through locations in a scan chain.

FIG. 13 is a tabular display applying simulated expected test results applied to a selected additional candidate shoot-through locations in the scan chain under analysis—demonstrating an example of increasing offset moving down the chain indicating multiple shoot-through locations.

FIG. 15A is a clock tree display showing non-delayed clock branches of the clock tree shown in FIG. 17.

FIG. 15B illustrates a defective clock net (Clk_42) within the clock tree of FIG. 17.

FIG. 16A is a simplified flow diagram illustrating in more detail a process for determining candidate locations of shoot-through cells using reset pattern analysis combined with physical clock skew analysis.

DETAILED DESCRIPTION

When a scan chain is defective in a semiconductor integrated circuit, i.e., one or more cells are not operating correctly, the data shifted through the scan chain may be corrupted, and determining what the problems are and where the problems are located is difficult. Scan chains are used to load (shift in) test pattern data into flip-flops and to unload (shift out) the device's response to the test pattern for comparison against expected values. If there is a defect in the device preventing a scan chain from operating (shifting) correctly, the values loaded into the flip-flops may not be the intended test pattern values invalidating the expected response and further the response values shifted out of the flip-flops may be corrupted when shifted out through the defective chain. For these reasons, a defective scan chain renders most scan test patterns useless for diagnosing failing devices. The flush test and reset test patterns, however, are designed to test the integrity of the scan chain and can detect when scan test failures are the result of a defective chain. Diagnosing defective scan chains is challenging due to the reduced diagnostic data and the limited diagnostic properties of that data.

Timing-related scan chain failures are particularly difficult to diagnose. One type of scan chain failure occurs when a clock signal driving a scan chain cell (generally a flip-flop circuit) is skewed or delayed relative to the clock on another cell that feeds into the delayed clock cell. Such a clock delay can lead to a "shoot-through" action during operation of the scan chain. In this case data in a first flip-flop "shoots through" an adjacent second flip-flop and loads into a third flip-flop adjacent to the second flip-flop. The second flip-flop's data is lost. And the first flip-flop's data is now advanced or "early" in the chain. That is, the first flip-flop's data will appear in the scan output one clock cycle ahead of its correct position. Of course, additional shoot-through cells in the same chain exacerbate the problem, resulting in data bits that are multiple clock cycles offset from their correct positions, as more fully explained later. Further, a defect on a clock signal may affect all cells on that clock branch, and/or a lower level clock branch that depends from it.

Figure 1:
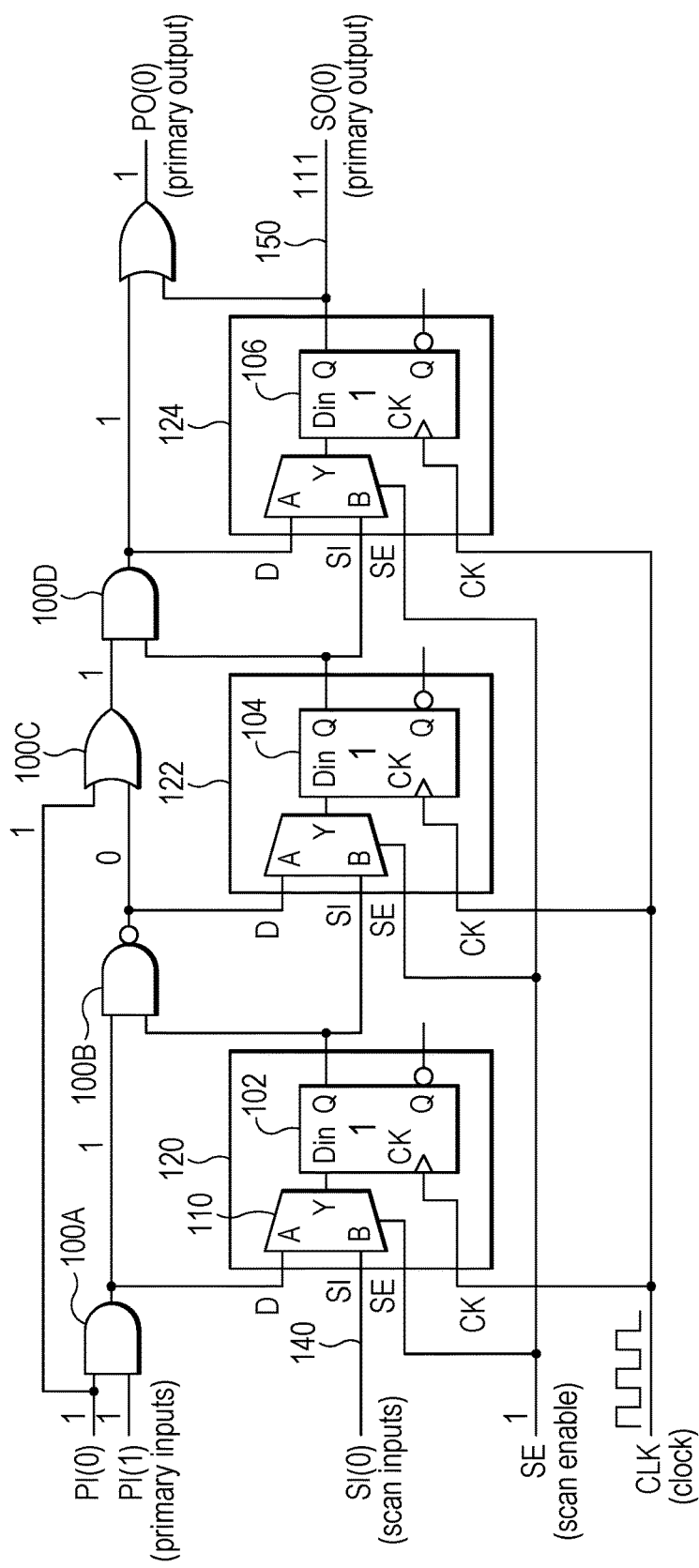
FIG. 1 is a simplified schematic diagram illustrating a scan chain coupled to a sequential circuit in a semiconductor integrated circuit.

FIG. 1 is a simplified schematic diagram illustrating a scan chain coupled to a combinational circuit in a semiconductor integrated circuit. The combinational circuit comprises logic gates such as logic gates 100A, 100B, 100C, 100D, etc. The combinational logic gates respond to voltage levels at primary inputs PI(0) and PI(1) and scan cell outputs, for example, scan cells 120, 122, 124. During normal functional operation, selected logic signals output from the gates 100A, 100B, and 100D may be clocked in to flip-flop circuits, for example, flip-flop circuits 102, 104 and 106 respectively, responsive to clock signal CLK.

The series-arranged flip-flop circuits form a scan chain as follows. Each flip-flop circuit has a corresponding multiplexer circuit on its D input. For example, flip-flop 102 has a mux 110 arranged to steer either a logic signal at mux input A, output from a logic circuit (100A), or a scan input signal (SI) presented at the other mux input B, depending on the state of the mux control signal which is coupled to a scan enable signal SE. Here, the Q output from each flip-flop is coupled to drive one of the functional logic gate inputs, and well as provide the scan input signal SI to the next scan cell in the chain. We use "scan cell" to refer to the combined flip-flop circuit and input mux, for example, scan cells 120, 122 and 124. During operation, while scan enable signal (SE) is low, that is, scan mode is disabled, the scan cells operate to clock in the functional path or logic signals D to Din of the corresponding flip-flop, and present the output Q as an input to a next logic gate. The scan inputs SI thus are ignored, and the sequential logic circuit operates normally.

When the scan enable (SE) is high (or in scan shift mode), the multiplexers in each cell steer the B mux input to the Din input of the corresponding flip-flop circuit, so as to clock the Q output state from each flip-flop into the next flip-flop Din input, such that the series of flip-flop circuits form a chain, like a shift register, here comprising flip-flop circuits 102, 104 and 106 in that order. Accordingly, during scan shift mode, the combinational logic gates are ignored, and the scan input signal at SI(0) is clocked through the chain responsive to the CLK clock signal. If a series of bits, also called a pattern, is presented at the scan input 140, the pattern will be output at the primary output 150, delayed by three clock cycles, if the scan chain is operating properly. A flush test operates this way, keeping SE high to shift various flush test patterns, for example, repeating 0011 through the scan chain to confirm data can successfully be shifted from the scan input pin to the scan out pin through the scan chain.

The scan chain can thus be used to test sequential circuits like testing combinational circuits. To do so, the shift register is first turned on (SE is high) to shift the test pattern in. This is also called a load operation. The shift register is then turned off (SE is low), and the clock applied to capture the state of the combinational elements or functional path of the signals. This is also called a capture cycle. Then, the shift register is turned on again (SE is high) and that captured state is shifted out, also called an unload operation, for comparison with the expected response values by the tester hardware.

Proper design of scan chains, and scan test patterns, especially in pin-limited IC's, can be used to test even very complex and deep sequential circuits. In some of the following examples, we describe methods for testing and analyzing the scan chain itself, rather than the combinational cloud logic. We describe a single scan chain for illustration, although in practice a real IC will have many scan chains. In some operations, detailed below, we utilize a load operation to insert a predetermined pattern into the scan chain and then clock out the resulting response pattern for analysis. In other cases, we insert a pattern serially and clock it through the chain, and again analyze the output, to identify and locate defects. A simple chain test, called a flush test, may be used to simply verify scan chain integrity—whether the scan chain is operational (even if there are defects in the combinational cloud logic). This may be done in some cases by shifting a simple sequence through the chain, for example, 001001001 . . . If this fails, other tests are likely to fail as well.

Figure 2:
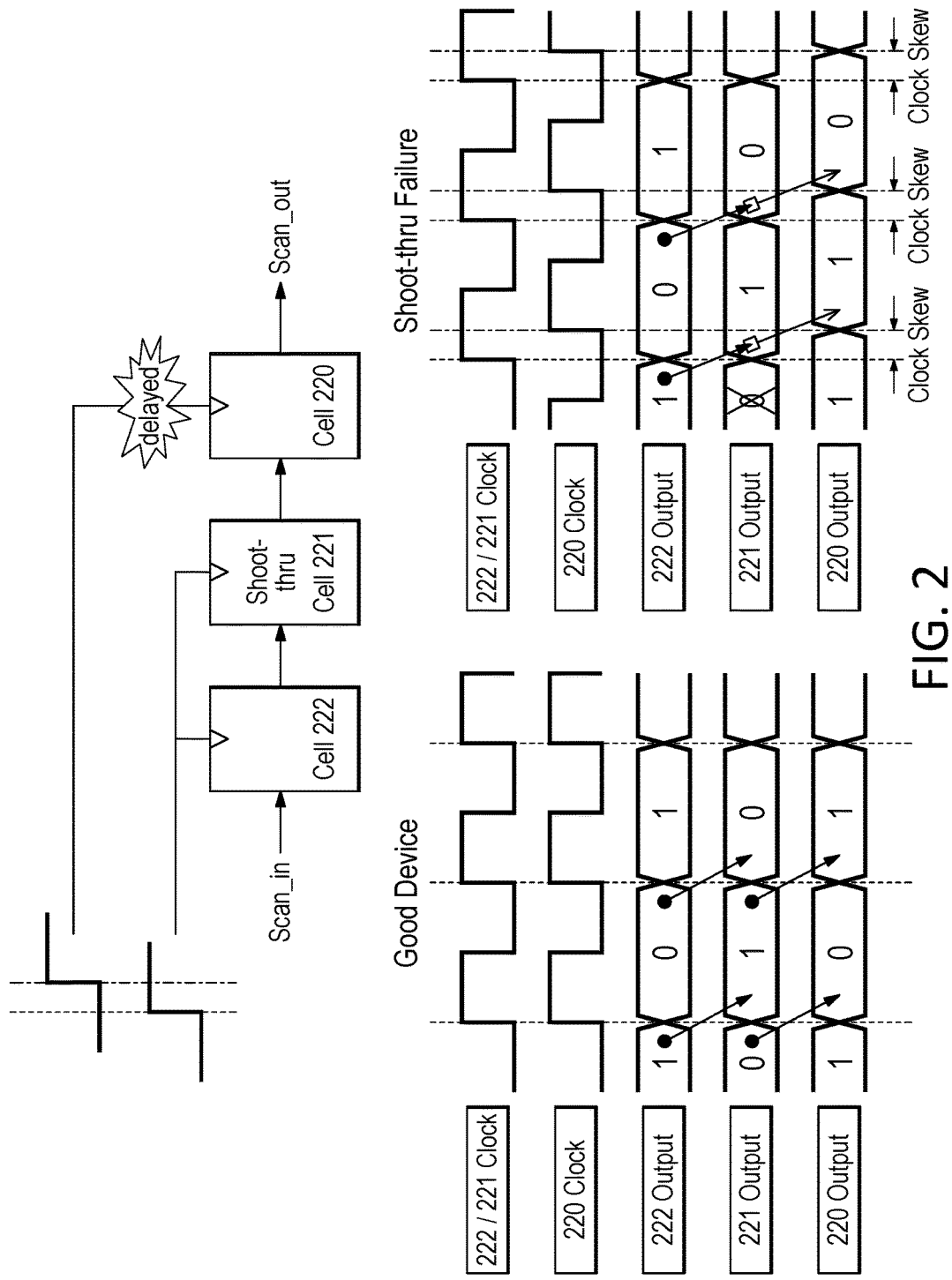
FIG. 2 is a simplified diagram illustrating shoot-through timing failure in a scan chain.

FIG. 2 is a simplified diagram illustrating operation of a scan chain. Here, the circuitry shown is operating in scan chain mode. The diagram shows a chain comprising flip-flop circuits or scan cells 222, 221 and 220 in that order. A Scan_in signal or bit is input to Cell 222, clocked to Cell 221 and then clocked to Cell 220, This operation is illustrated on the left side of the drawing figure under the heading "Good Device." As shown, a 1 bit at Cell 222 output is clocked into Cell 221 output, and thence into Cell 220 output. This illustration also shows an input bit pattern of alternating 1's and 0's.

Referring now to the right side of FIG. 2, under the heading "Shoot-thru Failure," the 220 clock signal is delayed, i.e., Cell 220 is being clocked later than its neighbors by an amount indicated by dashed lines as clock skew relative to the clock signals on 222 and 221. The conditions for shoot-thru occur when the clock skew is greater than the sum (clock-to-Q/QB time of the cell flip-flop)+net delay+ setup time. The impact of shoot-thru on the scan shift operation, as illustrated, is as follows:

(a) the data stream appears shifted forward one cycle, that is, output data appears to be one cycle "early";

(b) the shoot-thru cell's data (here Cell 221) is lost on the first clock cycle;

(c) The delayed cell's output (here Cell 220) is the same as the shoot-thru cell after the first clock cycle; and (d) Data "jumps" forward 1 clock cycle when passing through the shoot-thru cell.

Figure 5:
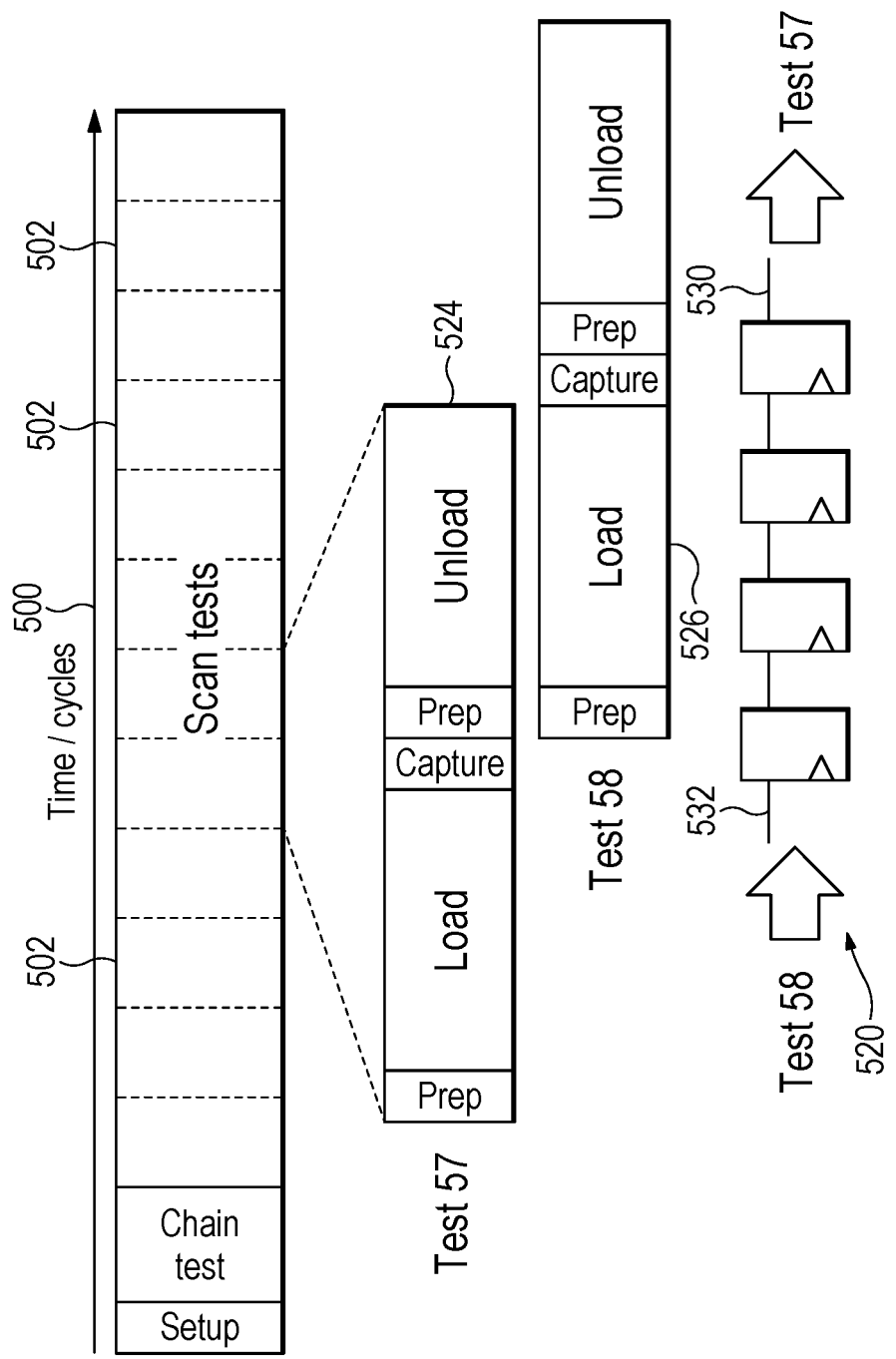
FIG. 5 is a simplified conceptual illustration showing the overlapping execution of loading a scan test while unloading the previous scan test's results when applying a sequence or pipeline of multiple scan tests.

FIG. 5 is a simplified conceptual illustration showing loading and unloading of a sequence or pipeline of multiple scan tests in general. Time/cycles is indicated by arrow 500. After setup, a series of scan tests 502 are arranged, for example, in a memory. One test, Test 57, is shown in more detail, comprising a prep segment, a load segment, a capture segment, another prep segment, and an unload segment. Each segment may consist of one or more bits or cycles. An adjacent test, Test 58, consists of an identical sequence of segments, although the actual bit patterns in the segments generally are different.

This figure illustrates the pipelining or overlapping of scan test patterns. Due to shifting bits through a serial shift register, it shifts data out (unload) as it shifts the next pattern in (load). In this figure, Test 57's pattern is first loaded/ shifted into the chain. Once the pattern is fully loaded, the values propagate from the output of the scan cells into the combinational clouds of logic. The scan enable signal determines whether the scan cells are configured to act as a shift register (load and unload operation) or to act in the normal functional mode capturing whatever is on their "D" input when the clock happens. During the capture process, if scan enable is low, the mux inside the scan cells select the functional input ("D" usually) capturing the results of the loaded pattern propagating through the combination cloud of logic. This is the normal scan operation (load pattern, capture results, shift results out/unload).

In FIG. 5, the response to Test 57's stimulus is captured into the scan cells on the chain. Then the scan enable is brought high again, configuring the scan as a shift register, and each clock cycle shifts out another bit of the response which may be compared to the expected values. As Test 57 is shifting out the scan_out pin 530, Test 58 is being shifting in though the scan_in pin 532 right behind it. The slide shows Test 57 Unload overlapping with Test 58 Load as each clock cycle as 1 bit shifts out of Test 57 results, 1 bit of Test 58 data is shifted in behind. The capture cycle is different for the Flush Test and the Reset Tests. During flush, the scan enable stays high such that the chain is always a shift register loading the flush pattern 0011 in and expecting the same to come out the other end. No combinational cloud/functional values are captured. Reset Test won't pulse the clock during the capture procedure, only the asynchronous reset signal resetting the scan cells before unloading.

Figure 3:
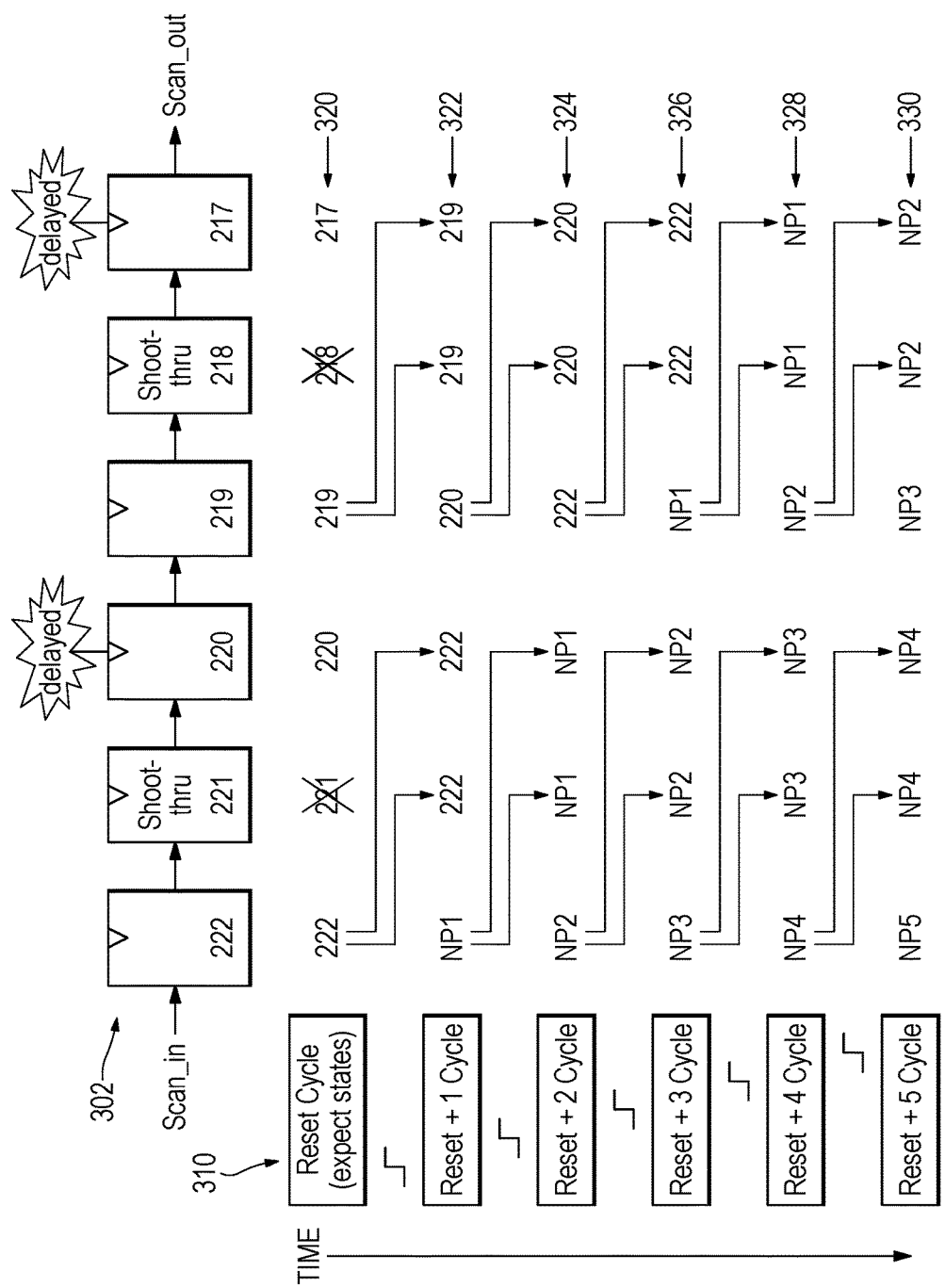
FIG. 3 is a conceptual diagram illustrating the effect of multiple shoot-through cells on scan reset data pattern.

FIG. 3 is a conceptual diagram illustrating the effect of multiple shoot-through cells on a scan reset pattern, with loss of shoot-through cell data on the first unload clock cycle. Here, a scan chain 302 comprises flip-flop circuits 222-217 arranged from left to right. Importantly, we use these numbers 222-217 to identify corresponding flip-flop circuits (or scan chain cells), and as a proxy for an initial bit value (actually 0 or 1) stored in the corresponding cell upon reset. In other words, at reset, cell 222 stores a value (0 or 1) at its Q output represented by "222." The last cell 217 likewise has an initial value represented by "217." We use parentheses around these values in this narrative to indicate they are not literal values but a proxy, as noted, for the initial or reset state bits in the chain to track their value shifting down the chain (unloading) cycle by cycle.

A serial bit pattern (NP or next pattern) may be presented at the Scan_in node, which may be coupled to a corresponding D input to the first cell 222 of the chain. The NP bits are identified, sequentially, as NP1 . . . NP5 in this illustration. The NP may be, for example, a flush pattern, such as Time advances vertically down the page, with each clock cycle indicated in the boxes 310. Each horizontal row 320, 322 . . . 330 shows the "values" (by proxy) stored in each cell, aligned below the corresponding cell. For example, in row 322 (Reset+1 clock cycle), cell 222 now stores a value NP1, cell 221 stores a value "222", cell 220 also stores "222" etc. The last cell 217 stores a value "219."

This figure thus illustrates the effects of multiple shoot-through cells as a pattern is clocked through the scan chain. Row 320 is the initial reset state. On the next clock, input pattern bit NP1 is shifted into flip-flop 222. The first bit "222" is shifted into flip-flop 221 and it also "shoots through" into flip-flop 220. The second bit at 221 is lost. The third bit "220" is shifted into flip-flop 219. The flip-flop 219 bit value "219" is shifted into flip-flop 218 and shoots through to flip-flop 217. The shoot-through flip-flop 218 value is lost as well. The resulting states are shown in row 322.

The next clock cycle (Reset+2 cycle) results in the values listed in row 324. In row 324 one can observe that the shoot-through flip-flop 221 value has been lost. More generally, the shoot-through cells' data (here 218, 221) are lost on the first clock. And the cell data comes out (at Scan_out) early by X cycles, where X depends on the number of shoot-through cells that each bit traverses when shifted out. In this simplified illustration, for example, bit "222" comes out at Reset+3 cycle, which is two cycles "early" because it traversed two shoot-through cells. The same is true of NP1 and NP2. Bits 219 and 220 come out one cycle early, because they traversed only a single shoot-through cell 218.

Figure 4:
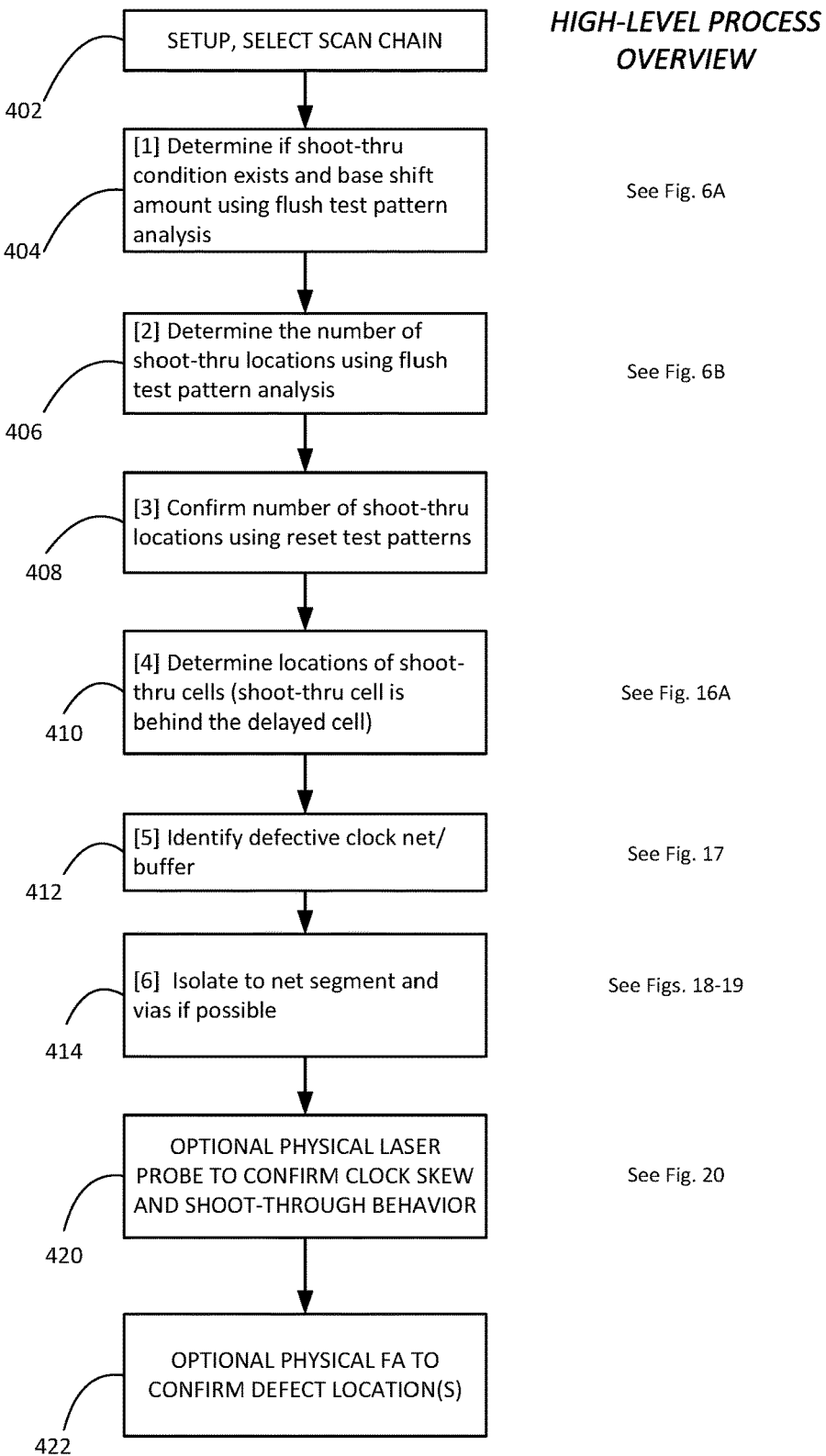
FIG. 4 is a simplified, high-level flow diagram illustrating a process for detecting and locating shoot-thru timing failures in a semiconductor integrated circuit.

FIG. 4 is a simplified, high-level flow diagram illustrating a process for detecting and locating shoot-thru timing failures in a semiconductor integrated circuit. The process may also include steps to identify the defective net or net segment, including vias, based on the shoot-through locations. To begin, the process in one example may be coupled to a suitable FA system or environment, which may be similar to the system illustrated in FIG. 21. Typically, one scan chain may be selected for test and analysis at one time, block 402. The first process step is to determine if shoot-through conditions exist, and to determine a base shift or "offset" amount (further explained below with reference to FIG. 6A), block 404. This refers to an offset between actual "unload" bits from the scan chain as compared to the expected unload bits.

Next, the process calls for determining a number of shoot-through locations (assuming that shoot-through condition(s) were found in the subject scan chain), block 406. Next, in an example, the process entails confirming the number of shoot-through locations using reset patterns, block 408. Reset test patterns and their use is described in more detail below with reference to FIG. 9.

Referring again to FIG. 4, the high-level process example continues with determining locations of the shoot-through cells, block 410. Recall a shoot-through cell is the one behind a delayed (clock skewed) cell, for example, shoot-through cell 221 in FIG. 3 is behind the clock delayed cell 220. Next the process calls for identifying a suspected defective clock net or buffer, block 412. Then, the defect may be isolated to a particular net segment and via(s), block 414. Optionally, a laser probe may be used to probe clock nets and scan cell outputs confirming clock skew exists between the shoot-through cells and their associated delayed cells and that shoot-through behavior is observed on the outputs of the scan cells, block 420. The defect location may also be confirmed by a physical FA techniques such as OBIRCH to confirm the via is bad and Dual Beam FIB to cut a cross section of the via and view it with a SEM (Scanning Electron Microscope), block 422. Each of these steps are described in more detail below. The following discussion describes some of these in more detailed examples, without limiting the broader concepts.

Figure 6A:
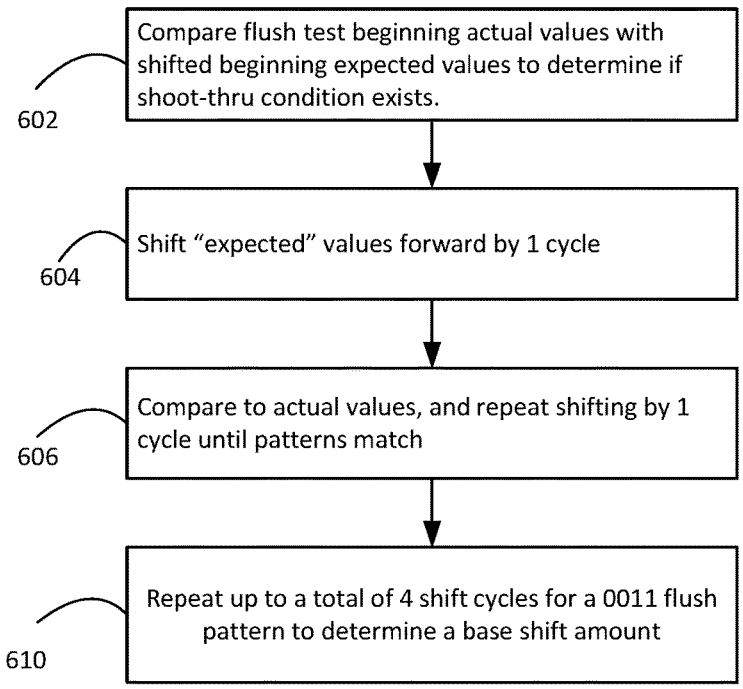
FIG. 6A is a simplified flow diagram illustrating in more detail aspects of the process illustrated in FIG. 4.

Referring to FIG. 6A, this simplified flow diagram illustrates, in one embodiment, detail of a process to determine if shoot-thru condition exists and a base shift amount. The process preferably is implemented programmatically. The process comprises comparing flush test beginning actual values with shifted beginning expected values to determine if shoot-thru condition exists, block 602. A flush test may comprise shifting a flush test bit pattern through the scan chain. Next, shift "expected" values forward by 1 cycle, block 604. Continuing, compare to actual values, and repeat incrementing the shift by 1 cycle until the patterns match, block 606. In one example, the shift increment is repeated up to a total of 4 shift cycles forward for a 0011 flush pattern to determine base shift amount, block 610. Other flush patterns, depending on the size of the repeating pattern, may suggest a different cap on the number of shifts to be analyzed. In the 0011 pattern example, the matching process may be analyzed as follows:

If 1 shoot-through will match every other cycle (except last 1)
If 2 shoot-throughs will match every cycle (except last 2)
If 3 shoot-throughs will match every other cycle (except last 3)
If 4 shoot-throughs will PASS flush test except possibly last 4
Sequence repeats if >4 shoot-throughs for pass/fail sequence, except the last X increases in line with the shift amount.
Base shift=1, 2, 3, or 4

Figure 6B:
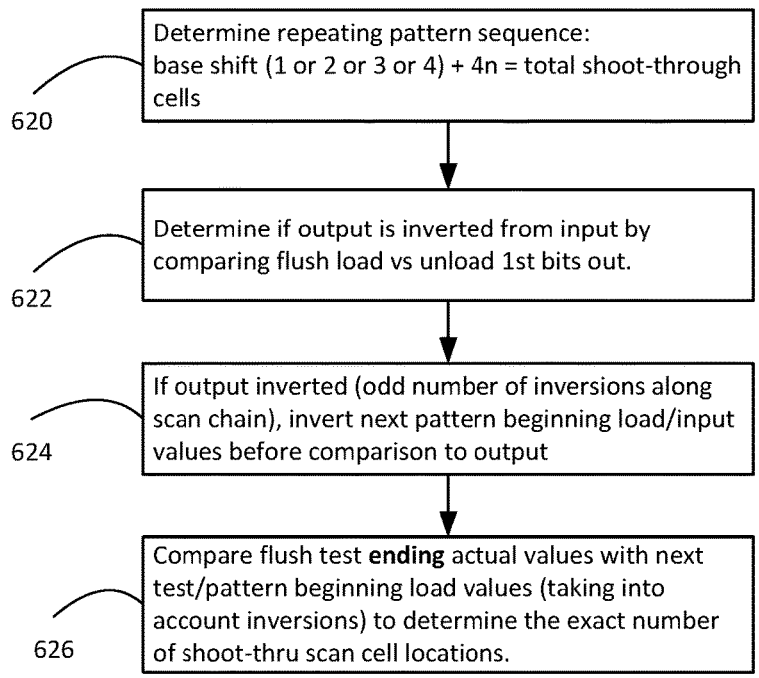
FIG. 6B is a simplified flow diagram illustrating in more detail aspects of the process illustrated in FIG. 4.

FIG. 6B is a simplified flow diagram that illustrates, in one embodiment, detail of a further process to determine the number of shoot-through locations. In an embodiment, the process may proceed as follows: First, determine repeating pattern sequence by adding "4n" to the base shift amount: total number of shoot-through cells=base shift (1 or 2 or 3 or 4)+4n, block 620. This is merely illustrative; some cases may have a larger shift caused by a greater number of shoot-through cells. Since 0011 flush patterns repeats every 4 cycles, the base shift amount can also be increased by multiples of 4 resulting in a match of the beginning actual values and shifted beginning expected values. For example, for a base shift forward of 2 cycles, the total shoot-throughs must be in the sequence 4n+2. Therefore, there are either 2, 6, 10, 14, etc. total shoot-thru locations. See block 620.

Second, determine if output is inverted from input by comparing flush load vs unload 1st bits out, block 622. If the chain has an odd number of inversions along the scan chain, the output will be inverted from the input whereas an even number of inversions results in the same values coming out of the chain as were loaded into the chain during a flush test.

If the output is inverted, the next pattern beginning load/input values must be inverted before comparing, block 624.

Third, compare flush test ending actual values to next test/pattern beginning load values (taking inversions into account), to determine the exact number of shoot-thru scan cell locations, block 626. For example, begin with an overlap value of the first number in the sequence and then increase by 4 cycles until patterns match, block 626. These processes are further illustrated by sample screen displays below.

FIG. 16A is a simplified flow diagram illustrating in more detail a process for determining locations of shoot-through cells in a semiconductor integrated circuit. In some embodiments, this process may correspond to block 410 in FIG. 4. Determining locations of shoot-through cells may include first identifying all scan cells that cannot be reset/set during a reset pattern. These cells will either have their reset/set pins tied off or they do not have reset/set pins. Once identified these cells should be marked such that their reset test expected values are ignored when used to compare against reset test actual values by changing their expected values to "X". Reset test failures on these non-resettable scan cells should be ignored. See block 1602.

Next, in some embodiments the process may use reset pattern data to determine potential shoot-thru cell locations/candidates. This entails comparing reset test actual values with expected values. See block 1606. Each time the expected values must be shifted forward or offset to match the actual values (except when comparing to the marked non-resettable cell values), the offset increases and a candidate or candidate range is identified, block 1610. A candidate range occurs when the expected value of the shoot-thru cell candidate matches the expected value of the previous cell(s). The range extends from the initial candidate location backwards including all cells with the same expected value, block 1620. These ranges together define a first set of candidates or potential shoot-through locations. This is referred to as reset pattern analysis on the left side of the figure.

Continuing to the right side of FIG. 16A, an example process is illustrated for utilizing physical clock skew analysis to determine a second set of potential shoot-through locations. First, an analysis is conducted of the physical clock tree branches and the scan chain order to determine potential shoot-through location candidates, block 1622. In some environments, the clock tree may be extracted from a netlist (for example, a DEF file) as all the other gates, flops, nets, etc.

In more detail, the process includes traversing the scan chain in the direction data is shifted out or unloaded, identifying potential clock skew issues between adjacent scan cells. If adjacent scan cells are on different physical clock branches, they have the potential for clock skew; block 1624.

If a cell's clock net is different than the previous cell's clock net in the chain, then the cell is a "delayed cell" candidate. The previous cell would be the "shoot-through cell" candidate. If a cell's clock net is different than the next cell's clock net, then the cell is a "shoot-through cell" candidate; block 1626.

Next, the first candidates identified by the reset analysis and the second candidates identified by the physical clock skew analysis may be combined, block 1632. Final shoot-through candidates are the intersection of the two candidate sets. Optionally, a simulation applying the final candidates may be conducted to confirm the analysis, block 1634. See discussion of FIGS. 12-14 below.

Figure 16B:
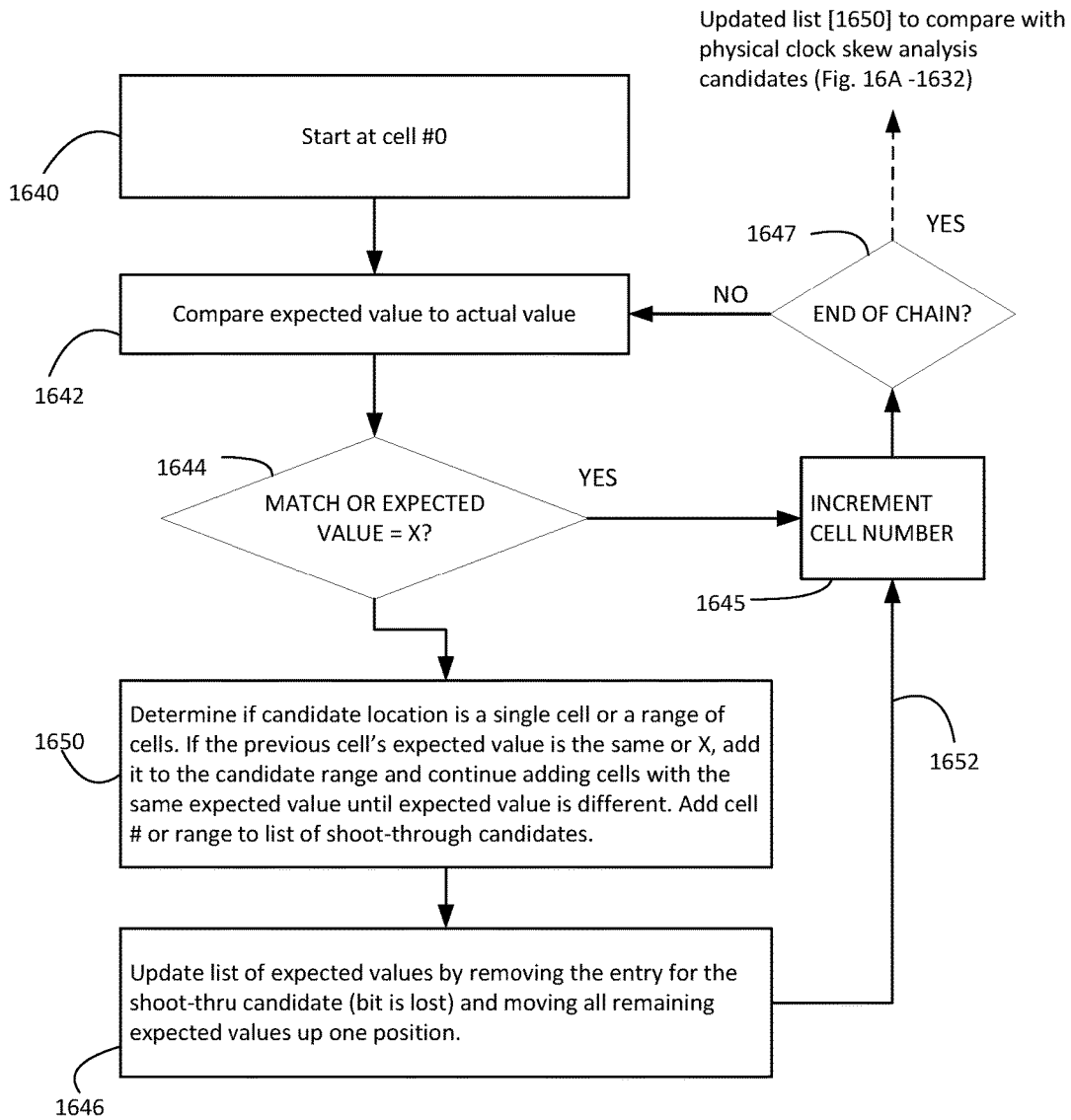
FIG. 16B is a simplified flow diagram illustrating an example of one process for identifying a candidate range of shoot-through cell locations based on pattern analysis.

Referring now to FIG. 16B, in some embodiments, a procedure to identify the candidate ranges based on reset pattern analysis may proceed as follows: Start at cell #0, see block 1640. Compare the expected value to the actual value, block 1642. If the values match or the expected value is X (non-resettable scan cell), decision 1644, increment the cell number, block 1645, and repeat the comparison step 1642 until reaching the end of the chain, decision 1647, otherwise continue to next step 1650.

Block 1650 calls for determining whether a candidate location is a single cell or a range of cells. If the previous cell's expected value is the same (a match) or X (don't care), add it to the candidate range and continue backwards in the scan chain adding cells with the same expected value until the expected value is different. Add the cell number or range of cell numbers to the list of shoot-through candidates. Next, update the list of expected values by removing the entry for the shoot-through candidate (bit is lost) and moving all remaining expected values up one position. See block 1646.

The original cell number should be stored with the expected value to retain the cell number when it is shifted up in the list. When a mismatch occurs, it is this cell number, not the actual value cell number that is used to identify the shoot-thru cell location or range. When a range is encountered, it is the highest cell number in the range which is removed when updating the expected values list. Then, increment cell count and loop back to block 1642 via path 1652 if the end of the chain has not been reached (decision 1647). The result of this process is a list of candidate ranges, that is, each range comprising a contiguous set of cells, each of which is a candidate shoot-through cell in the scan chain.

Figure 16C:
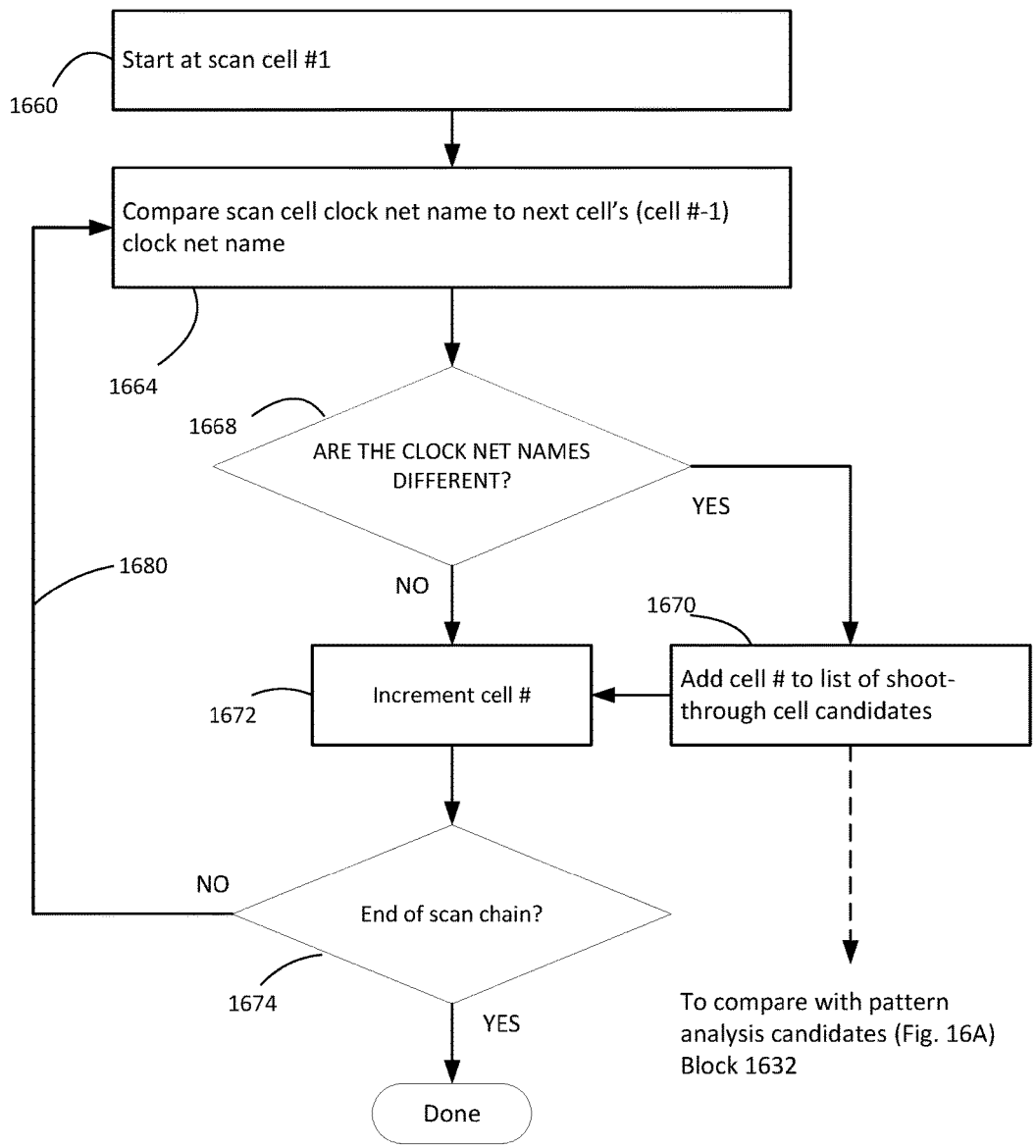
FIG. 16C is a simplified flow diagram illustrating an example of one process for identifying shoot-thru cell location candidates based on physical clock-skew analysis.

FIG. 16C is a simplified flow diagram illustrating an example of one process for identifying shoot-thru cell location candidates based on physical clock-skew analysis. In more detail, the process analyzes the physical clock tree branches and scan chain order to determine potential shoot-thru location candidates. This information can narrow down pattern analysis candidate ranges to a specific cell number and confirm individual pattern analysis candidates.

The process may include traversing the scan chain in the direction data is shifted out or unloaded and identifying potential clock skew issues between adjacent scan cells. If adjacent scan cells are on different physical clock branches, they have the potential for clock skew. If the cell's clock net is different than the previous cell's clock net in the chain, then the cell is a "delayed cell" candidate. The previous cell would be the "shoot-thru cell" candidate. If the cell's clock net is different than the next cell's clock net, then the cell is a "shoot-thru cell" candidate.

FIG. 16C illustrates such a process in one example. This simplified flow diagram shows beginning the process at scan cell number 1 (the second scan cell on the chain as scan cell 0 is the first and directly connected to the scan_out pin), block 1660. Next, comparing the scan cell's clock net name to next cell's (cell #-1) clock net name, block 1664. If the clock net names are different, decision 1668, add the cell number to a list of shoot-thru cell candidates, block 1670, and then increment the cell number, block 1672. If the names are not different, increment the cell number without adding to the list. Next, check for end of the chain, decision 1674, and if negative, loop back via path 1680 to repeat step 1664, that is, compare the clock net name for the next cell, and so on until the end of the chain is encountered. In this discussion, we described the perspective of generating "shoot-thru" cell locations, rather than "delayed" cell locations, and incrementing. We are traversing the scan chain in reverse order. Equivalently, the process could be arranged to proceed the opposite direction, adjusting the start/end tests and whether to increment or decrement.

Referring to FIG. 16A, block 1632, we combine the pattern analysis candidate information with the clock skew analysis candidate information, retaining the intersection of the two sets. The total candidates should equal the total candidates from determined as described above. If additional candidates are needed to meet the known total shoot-thru locations, the process may store physical candidates that cannot be ruled out by the pattern result data. Next, the process may simulate the final candidates by modifying the expect data to reflect the effects of the candidate locations, and confirm that the actual values match the simulated expect values. See discussion of FIGS. 12-14.

Referring again to FIG. 4, we have elaborated thus far on more detailed examples of steps 404, 406, 408 and 410. The next step of the high-level process, block 412, may comprise determining a defective clock net/buffer by traversing the clock tree from the lowest level (stage 1) clock net of a "delayed" cell candidate, upwards through the stages until all the clock branches that contain "delayed" scan cells are included. The defective clock net/buffer will be common to all "delayed" cells. Recall a "Delayed" cell is the next cell after a shoot-through cell (shoot-through cell #−1).

Figure 22:
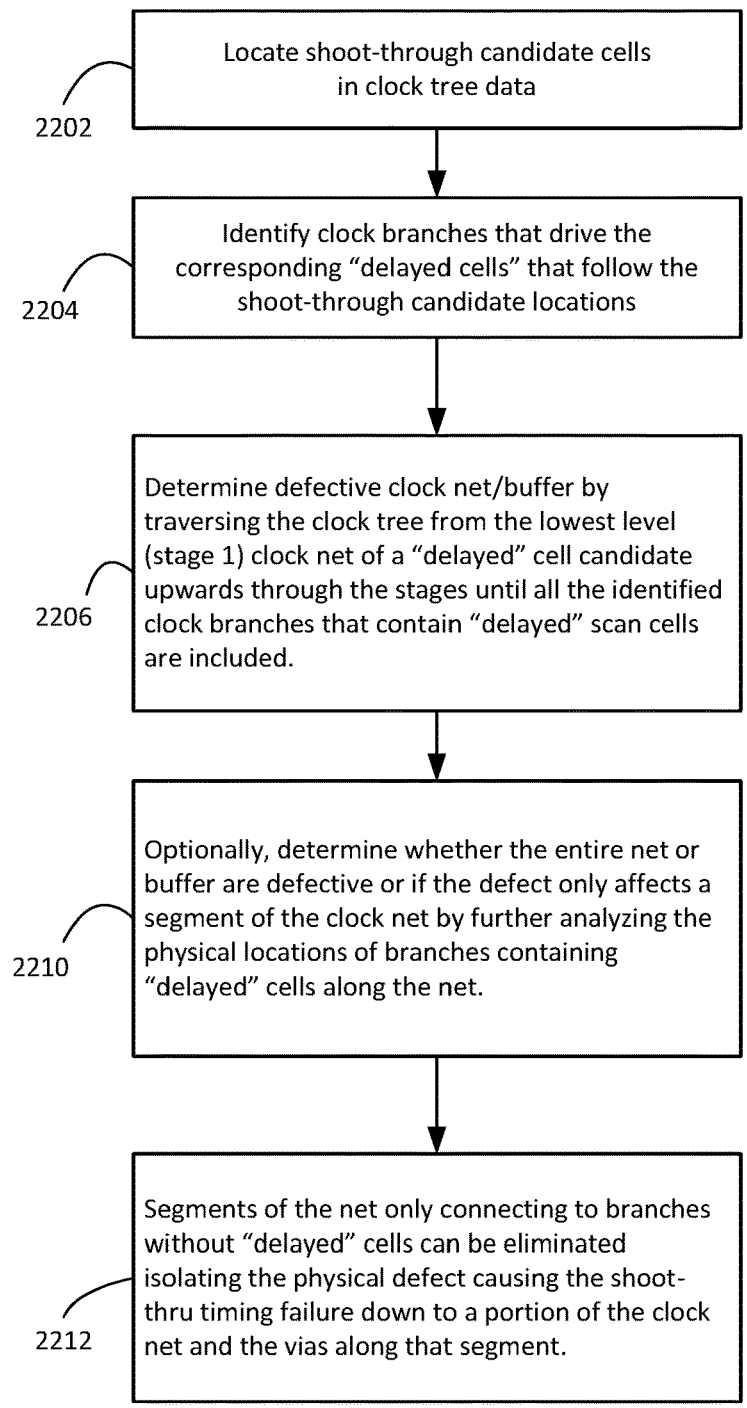
FIG. 22 is a simplified flow diagram showing in more detail an example of a procedure to identify the defective clock net/buffer based on shoot-through locations.

FIG. 22 is a simplified flow diagram showing in more detail an example of a procedure to identify the defective clock net/buffer based on the shoot-through cell locations. First, locate shoot-through candidate cells in clock tree data, block 2202. Next, identify clock branches that drive the corresponding "delayed cells" that follow the shoot-through candidate locations, block 2204. Next, the process determines a defective clock net/buffer by programmatically traversing the clock tree from the lowest level (stage 1) clock net of a "delayed" cell candidate, upwards through the clock stages, until all the identified clock branches that contain "delayed" scan cells are included, block 2206. This identification of skewed clock branches can be used to locate causes of the shoot-through issues, which in turn may be address by changes in design, layout or fabrication of the type of IC under test.

Optionally, see block 2210, further inspection of the clock tree may be used to determine whether the entire net or buffer are defective, or if the defect only affects a segment of the clock net. This entails further analyzing the physical locations of branches containing "delayed" cells along the net. Segments of the net only connecting to branches without "delayed" cells can be eliminated, thereby isolating the physical defect causing the shoot-thru timing failure down to a portion of the clock net and the vias along that segment; see block 2212. This process corresponds, in some embodiments, to FIG. 4, block 414.

Figure 7A:
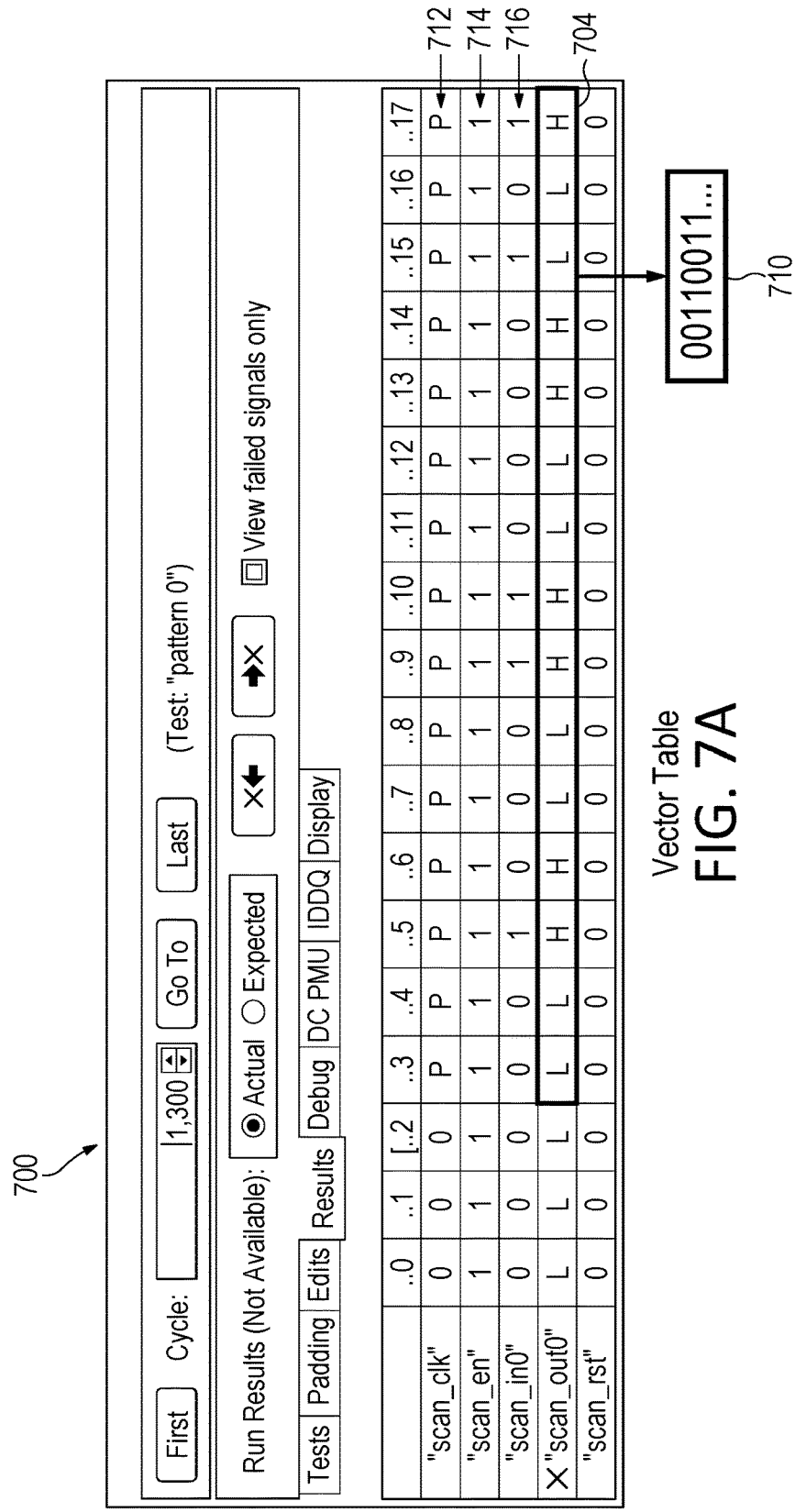
FIG. 7A illustrates an example of flush pattern scan test results (vector table) showing an actual scan chain output bit pattern.

Actual test data is shown in the following figures to further illustrate the foregoing discussion. FIG. 7A illustrates an example of flush pattern scan test results display 700 (Test: "pattern 0"). This shows all pin values, starting at clock cycle 1,300. The flush test unload actual values on the "scan_out0" pin begin at cycle 1303 showing the first 15 bits of the flush test result, box 704. The "X" next to "scan_out0" pin indicates that at least one cycle is failing for that pin, over all of the cycles for a sequence of scan tests. The display only shows the test results over a portion of the total test cycles, 18 cycles in this case (cycles 1300-1317). For devices with multiple chains, the X on a pin indicates that the pin which corresponds to a chain has a failure. The input was a flush test "pattern 0" further explained below. The output bits are shown in binary numeric form at box 710. One can observe the clock pulses or cycles at row 712, the scan enable signal at row 714, and the scan input data at row 716. Such tests can be conducted using known equipment, for example, in the environment illustrated in FIG. 21.

FIG. 7B illustrates an example of a flush pattern scan test view display 720, showing further results of the "pattern 0" test of FIG. 7A, indicated at box 722. This view shows multiple cell results in tabular form at table 724. Specifically, results are shown for cells (Cell Index numbers) 1264-1296 (with cells 1269-1289—all failed—omitted for clarity.) This is the input end of the chain (cell 1296), which are the last bits to be unloaded when shifting out. These may be referred to as flush test ending values. One may refer to this range of cells (1264-1296) as an "inspection region" when comparing flush test ending values.

"Pattern 1" is the unload pattern for load Pattern 0. That is, we are unloading the flush test (pattern 0) while loading the next pattern 1, in a pipelined manner as discussed above with regard to Figure S. All of the cells in this example failed the flush test except cells 1292 and 1296 near the end of the pattern. A process for analyzing the flush pattern results may comprise the following steps—

(a) inspect the results for the beginning and ending portions of the chain. In the example, cells 1264-1296 are inspected for the ending portion of the flush test. Identify the failed cells and the passed cells in the inspected portions, and store this data in memory. Here, every cycle fails, except two close to the end.

(b) compare the stored results to the expected output, "Parameter Value" 726.

(c) based on comparing the results in table 724 to the flush pattern in the inspection regions, determine a number of cycles of offset consistent with the beginning actual test results. Here, the pattern is HHLLHHLLHHLL . . . . As explained above, a process may begin with analyzing one cycle offset. One bit or cycle of offset would have resulted in every other cell changing from fail to pass (leaving aside for the moment the passing cells 1292, 1296 (rows 730, 732 respectively)). Therefore, one bit offset is not consistent with the results. Therefore, increment the offset under consideration. Two cycles of offset would account for every cycle failing except possibly the last 2 bits. This is consistent with the beginning of the flush test results all the way until cell 1292 which would pass if the offset was only 2.

(d) In like fashion, increment the number of offset cycles and analyze additional possible offsets for consistency with the actual results. Three cycles again would lead to every other cell passing. Four cycles would result in all cycles passing except possibly the last 4 bits which is inconsistent with the results. Since the flush test pattern of 00110011 . . . repeats every 4 cycles, adding 4 or multiples of 4 cycles to the base offset amount of 2 will result in all cycles failing except possibly the ending bits which is consistent with the results. Because passing cell 1292 is five bits from the end of the chain, we conclude the offset is at least 6. Thus, the actual number of shoot-throughs may be described by an arithmetic series 4n+2 where n must be >=1 such that the total number of shoot-through locations is either 6, 10, 14, . . . . This is one example of a process corresponding to block 406 in FIG. 4. This logic preferably may be implemented in software as mentioned above.

End of chain (cell index 1296) means those are the last bits shifting out. One can imagine the bits shifting upward and out the top of the table 724 in FIG. 7B. Thus, the next bits are the first bits of a next input pattern coming in at the bottom of the table. The input shifts into the higher number cell indexes first. In the case of a shoot-through, so that one or more bits are advanced—are coming out sooner, meaning those bits are moved UP in this list. That is why shoot-through can cause next pattern bits to advance into flush test results. More specifically, for N shoot-through cells in the subject scan chain, we expect N bits of data to enter the chain from the next pattern during shifting out of the flush pattern. This was illustrated in FIG. 3 where the next pattern bits NP advanced into the scan chain. Depending on the NP bits values being loaded, they may or may not match the expected flush ending unload values which explains why some bits pass and some bits fail in the last 6 bits.

In some embodiments, the process may continue by expanding the inspection region to include a portion of an incoming next pattern. To conduct this test, therefore, a second test pattern is pipelined to shift into the scan chain immediately following (concatenated with) the first pattern, namely the flush Pattern 0 as indicated in the setup box in the display. That is, the inspection region bridges the last cycles of one pattern and the beginning cycles of the next pattern.

Figure 8:
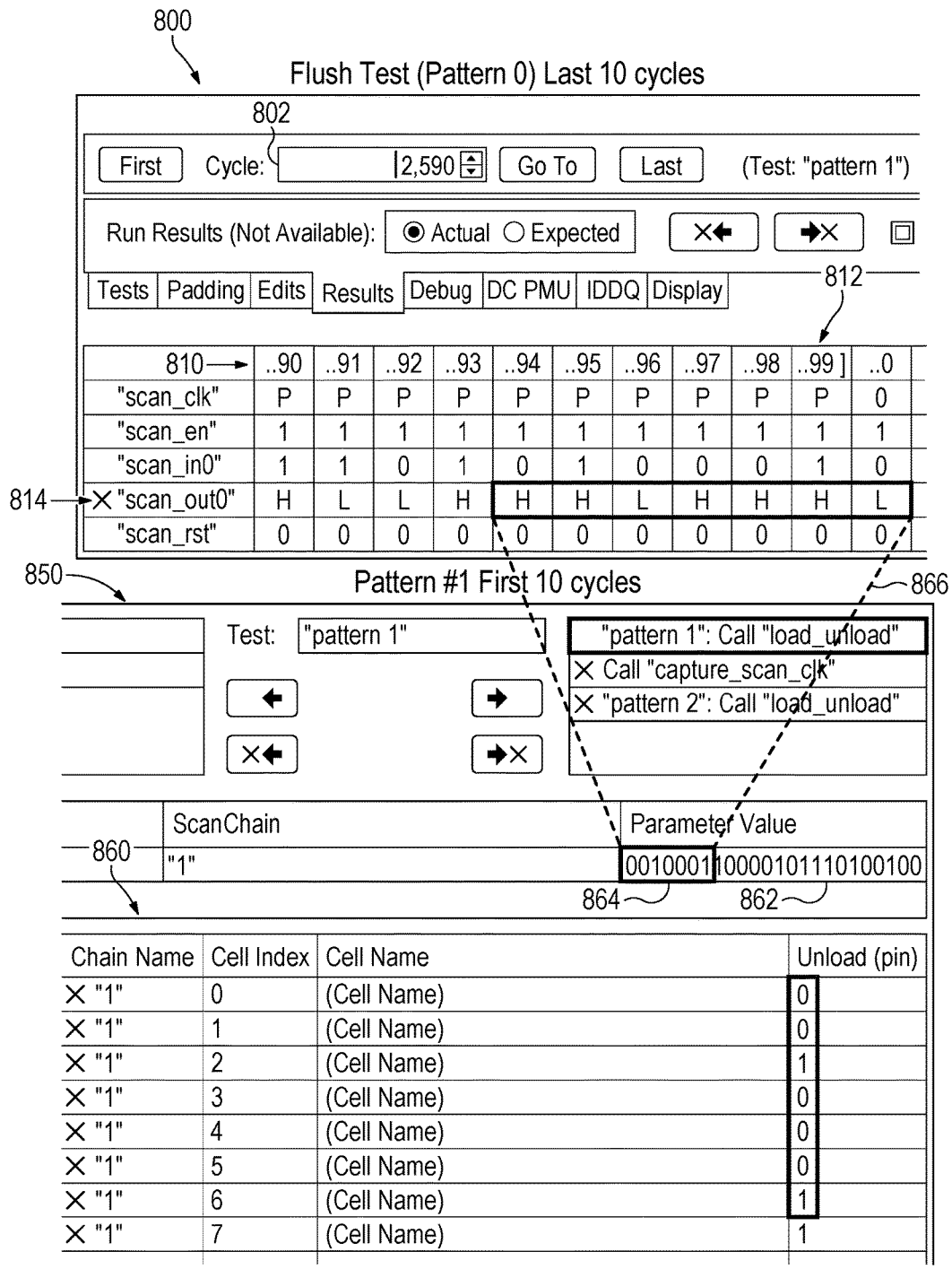
FIG. 8 illustrates a flush test pattern analysis including comparing last X (here 10) bits at end of chain actual values of flush test (Pattern 0) to the first X cycles of an incoming second test pattern (Pattern #1) for determining a number of shoot-through cells.

FIG. 8 illustrates a flush test pattern analysis including comparing a last X (here X=10) cycles at end of flush test pattern actual values (Pattern 0) to the first 10 load values of an incoming second test pattern (Pattern #1). (This integer variable X is not to be confused with a "don't care" bit value.) In more detail, the last 6 unload values of the flush test match the inverted first 6 load values of the second test pattern resulting in exactly 6 shoot-thru locations. The inverted 7th load bit of the second pattern also matches the pre-capture cycle value on the scan_out pin further confirming the conclusion of 6 total shoot-thru locations. In this comparison, inversions should be considered as explained above. If the total number of inverters in the chain is odd, inverted results can be expected.

In one example, an analysis process preferably includes the steps of:

(a) comparing end of scan chain last X cycles actual values to the first X load cycles of a next, incoming pattern; where X is selected based on the tentative number of shift locations determined from the flush test analysis. Since the suspected number of locations is 6 or more, around 10 cycles is sufficient to see if six bits match and if the following bits do not.

(b) taking inversions into account.

(c) identifying any cells in the actual output values (flush Pattern 0) that match the incoming Pattern #1.

A specific example is shown in FIG. 8. Here, the top portion 800 displays a last 10 cycles of the flush test results. The cycle is identified at box 802. The "scan_out0" data, row 814, has an "X" indicator that the scan chain failed the flush test. As mentioned above, for N shoot-through cells in the subject scan chain, we expect N bits of data to enter the chain from the next pattern during shifting out of the flush pattern.

The area 850 in this display identifies the test patterns in use. The table 860 below shows the pattern 1 load values, beginning at the start of the pattern, cell index 0. The pattern, "Parameter Value" is listed at box 862. A first portion identified by box 864 shows the first 6 bits of pattern #1 load values matching the last 6 bits of the flush test (pattern 0) results, inverted, as indicated by dashed lines 866. (A seventh (load) bit also matches.) The analysis thus established that the last 6 bits of the flush test matched pattern #1 first 6 bits inverted. It can be concluded that there are exactly 6 shoot-through cells in the scan chain illustrated. This example may correspond in some embodiments to the box 406 in FIG. 4. mark FIG. 9 illustrates further pattern analysis including examining a reset test pattern. The reset test pattern analysis is similar to the flush test analysis, comparing the last X (here 10) unloaded actual bits at end of chain of reset test (Pattern 18) to the first X cycles of an incoming second test pattern (Pattern #19), for determining a number of shoot-through cells. The last 6 unload values of the reset test also match the inverted first 6 load values of the second test pattern #19 resulting in exactly 6 shoot-thru locations. The inverted 7th load bit of the second pattern also matches the pre-capture cycle value on the scan_out pin further confirming the conclusion of 6 total shoot-thru locations.

FIG. 10 is an example of a screen display of scan chain test results and expected unload values to illustrate an example of a reset pattern analysis to help identify shoot-thru location candidates based on pattern offsets. As distinguished from FIG. 9, FIG. 10 illustrates using only the reset pattern's expected vs actual values. The expected values for cells 215 through 244 are shown in the Unload (pin) column, and an "X" marks the cells that fail (results), that is, where the Unloaded actual values (not shown) do not match the expected state. In an embodiment, a process may programmatically parse through the cell results looking for a pattern offset that would explain the cell failures. Proceeding down the chain, the process "looks for" an increase in pattern offset going down the chain.

Figure 14:
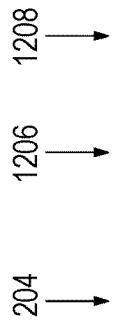
FIG. 14 is a tabular display applying simulated expected results applied to selected candidate shoot-through locations in a scan chain, showing apparent cell failure explainable by reset tied high in specified cells.

FIGS. 12-14 illustrate a simulation analysis to confirm candidate shoot-through locations. This example utilizes a reset pattern #18. In FIG. 12, the process compares actual results (scan cell output bits), to simulated expected results, column 1206, applying the candidate shoot-through locations. Here, assuming bit 218 was lost since it's a shoot-through cell candidate and therefore bit 219 jumps forward 1 cycle, the offset would be one cycle. The L bit from 219 is now expected at cell location 218, which is confirmed. Continuing, if bit 221 is lost since it's a shoot-through cell candidate, there would now be a 2-bit (or two cycle) offset in the chain data, which is confirmed by the H bit at cell 222 appearing at cell 220 in the actual data.

FIG. 13 illustrates additional simulation results. Here, the data confirms that with cell 306 bit lost, there is a total offset=3, as confirmed in the simulated expected output. Other results are illustrated and explained in the Comment column.

FIG. 14 is a tabular display illustrating further simulated expected results applied to candidate shoot-through locations in a scan chain. In this case, there are mismatches between the simulated expected values, column 1206, and the actual output values, column 1208. The simulated expected values based on shoot-thru candidate locations should match the actual output values to confirm the shoot-thru locations. In this case, the mismatching simulated expected values and actual values can be explained by those cells not having a reset capability during a reset test, as indicated in the Comment column.

Physical Clock Tree Analysis—Potential Clock Skew

Figure 11:
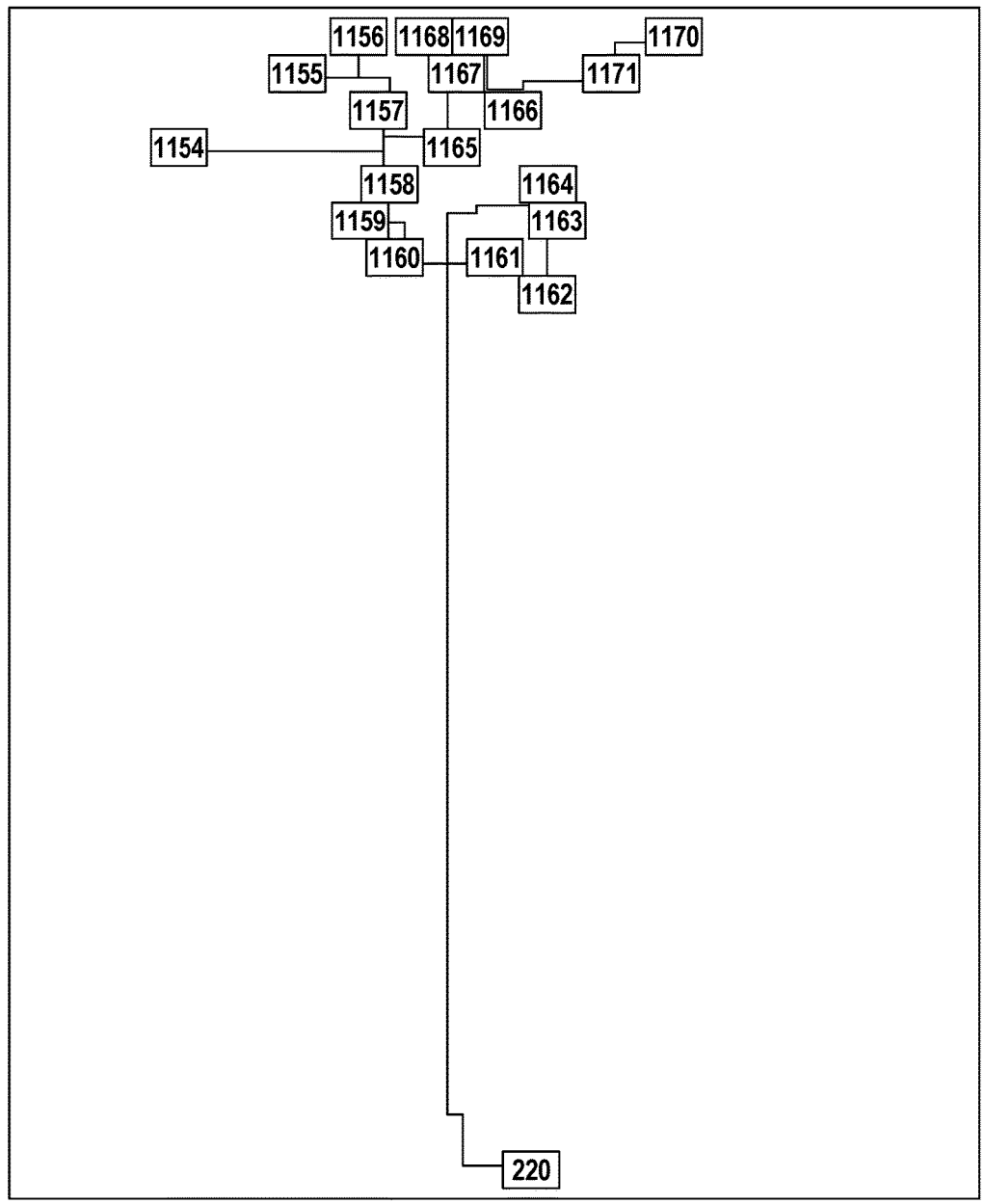
FIG. 11 is a simplified illustration of a defect isolator (DI) system screen display showing a selected clock branch including scan cells and their shared clock net for analysis of potential clock skew problems.

FIG. 11 is a simplified illustration of a defect isolator system screen display showing a selected clock branch including scan cells and their shared clock net for analysis of potential clock skew problems. Each small rectangle represents a scan cell and shows the cell index number. Here, one can see all the cells that share a common clock branch with delayed cell 220 discussed above.

Based on the analyses above, it was determined, in one example, that 6 scan cells that have clock skew resulting in shoot-through. These six delayed cells are shown in a clock tree display in FIG. 17:

cell 217
cell 220
cell 305
cell 532
cell 1171
cell 1269

Figure 15C:
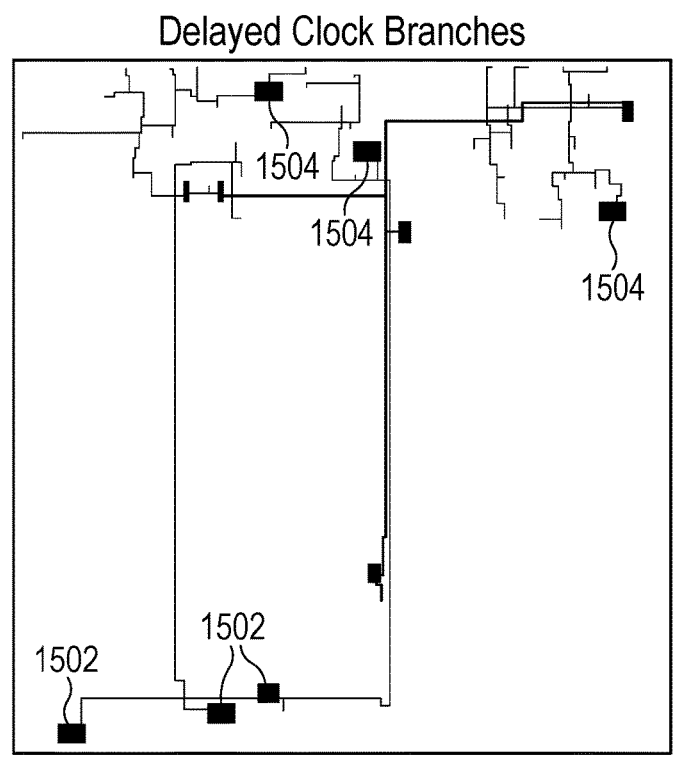
FIG. 15C is a clock tree display showing delayed clock branches off of a stage 3 defective clock net in the clock tree of FIG. 17.
Figure 17:
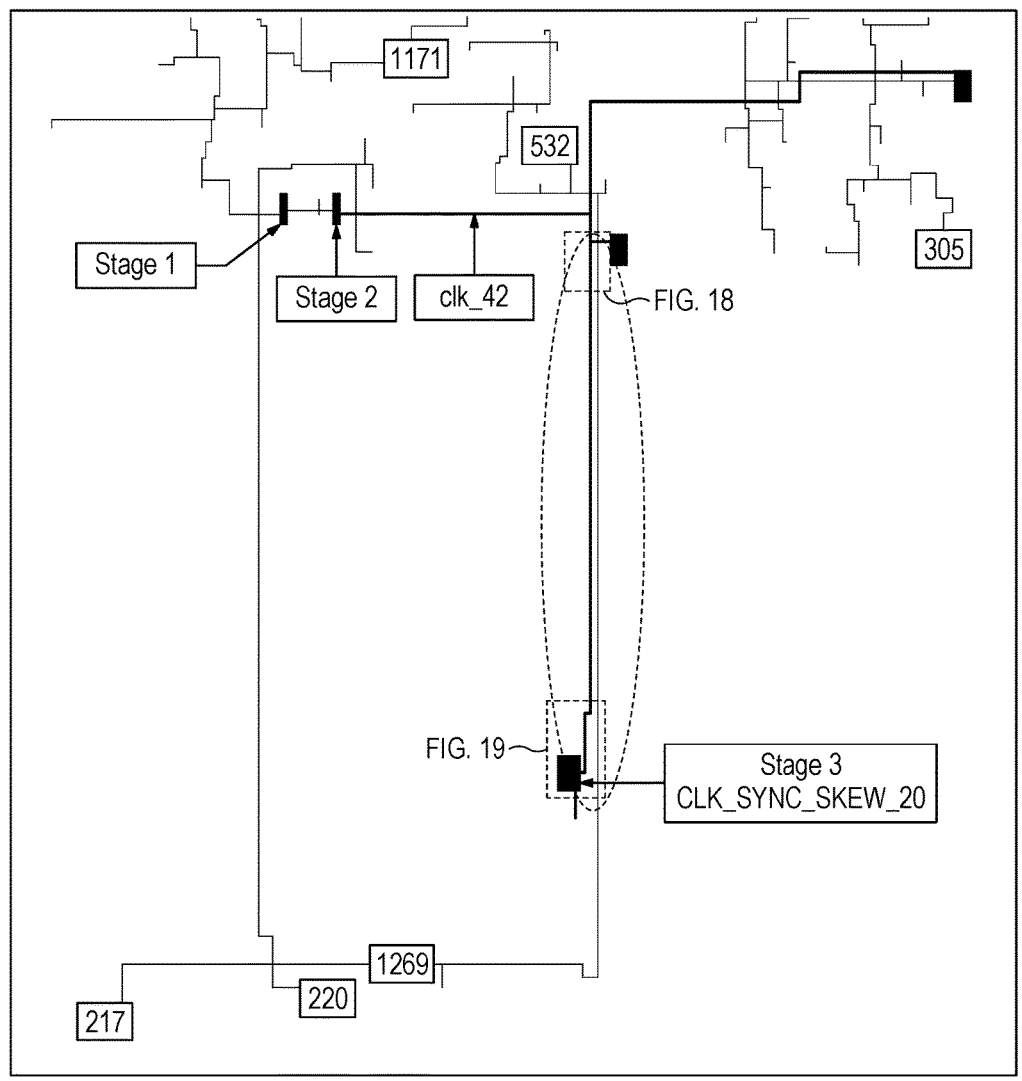
FIG. 17 is a simplified illustration of a defect isolator system screen display showing the defective clock net segment, the delayed clock branches and the delayed cells associated with each shoot-thru cell.

FIGS. 15A, 15B, and 15C break down the tree of FIG. 17 into several parts. In FIG. 15C, the six cells apparently suffering clock skew are shown (although not numbered here) as rectangles 1502, 1504 in a clock tree display. These are the larger rectangles, whereas the smaller ones are clock buffers or inverters. This identifies the delayed clock branches off of stage 3 defective clock net Clk_42, illustrated separately in FIG. 15B. One can observe, or programmatically determine, that there is one non-delayed branch with sub-branches off Clk_42 with no shoot-through observed. See non-delayed clock branches in FIG. 15A. There are three delayed branches off Clk_42 with shoot-through in the upper net portion, FIG. 15C. Therefore, the logic may conclude that the defect must be on a clock net segment below the upper three delayed branches.

Referring again to FIG. 17, Clk_42 is a stage 3 branch, driven by Stage 3 buffer identified as "CLK_SYNC_SKEW_20." All six skewed cells are clocked by the same Stage 3 driver or its children (Stage 2, Stage 1). For example, cell 1171 is clocked at Stage 1, coupled through Stage 2 buffer, to the Stage 3 branch Clk_42. In other words, the three different delayed clock branches necessary to cover the skewed cells all converge at Stage 3 branch Clk_42. Thus, all candidates can be explained by a defect on stage 3. This information confirms the earlier identification of the candidate cells.

Figure 18:
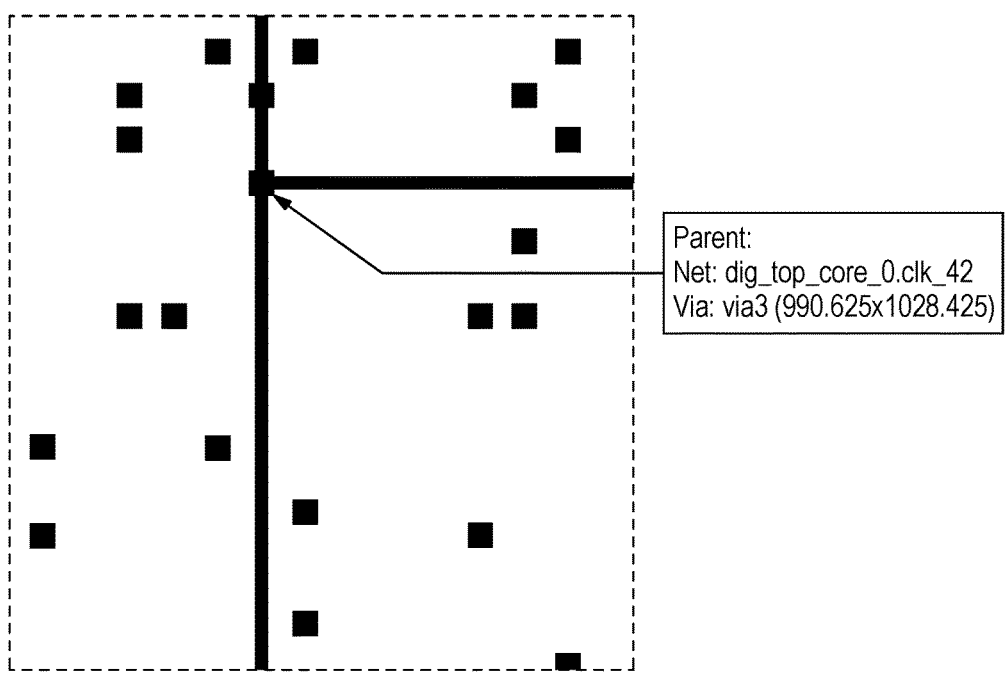
FIG. 18 is a simplified illustration of a defect isolator system screen display showing a magnified layer view of metal and via layers only of the upper portion of the clock net Clk_42.

FIG. 18 is a simplified illustration of a defect isolator system screen display showing a magnified layer view of metal and via layers only. This is a zoomed (enlarged) portion of the display of FIG. 17 where indicated by a dashed box.

Figure 19:
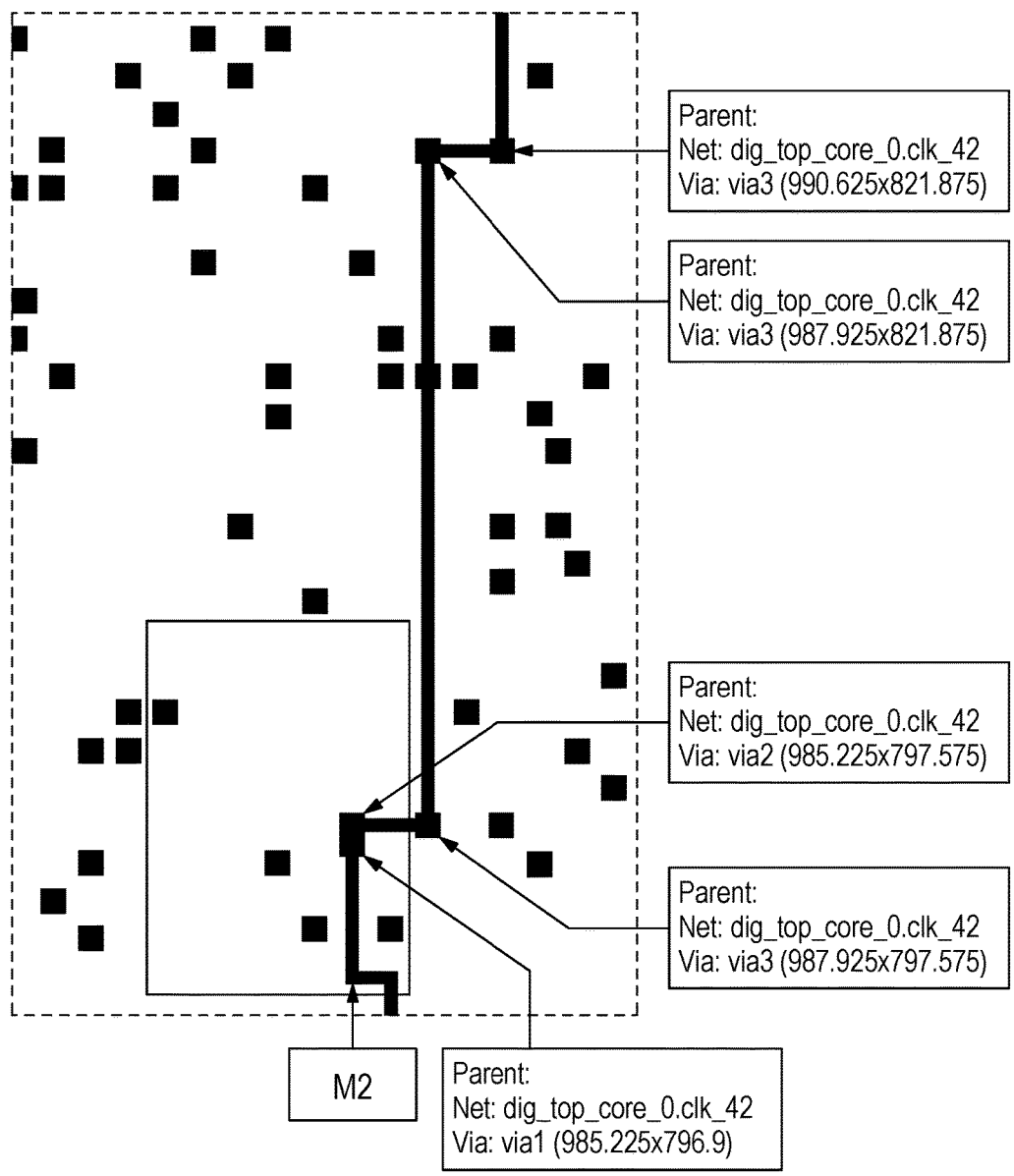
FIG. 19 is a zoomed portion of the screen display of FIG. 17 showing a magnified layer view of metal and via layers only of the lower portion of the clock net Clk_42.

FIG. 19 is a simplified illustration of a defect isolator system screen display showing a magnified layer view of metal and via layers only. Refer to the dashed box in FIG. 17. Five via locations (X-Y coordinates) along the defective net segment are identified. Based on the defective net segment, the top four vias are identified as potentially defective. The bottom vial is identified as a via to inspect during physical failure analysis (for example, with a Dual Beam FIB) since it is next to the defective via.

Figure 20:
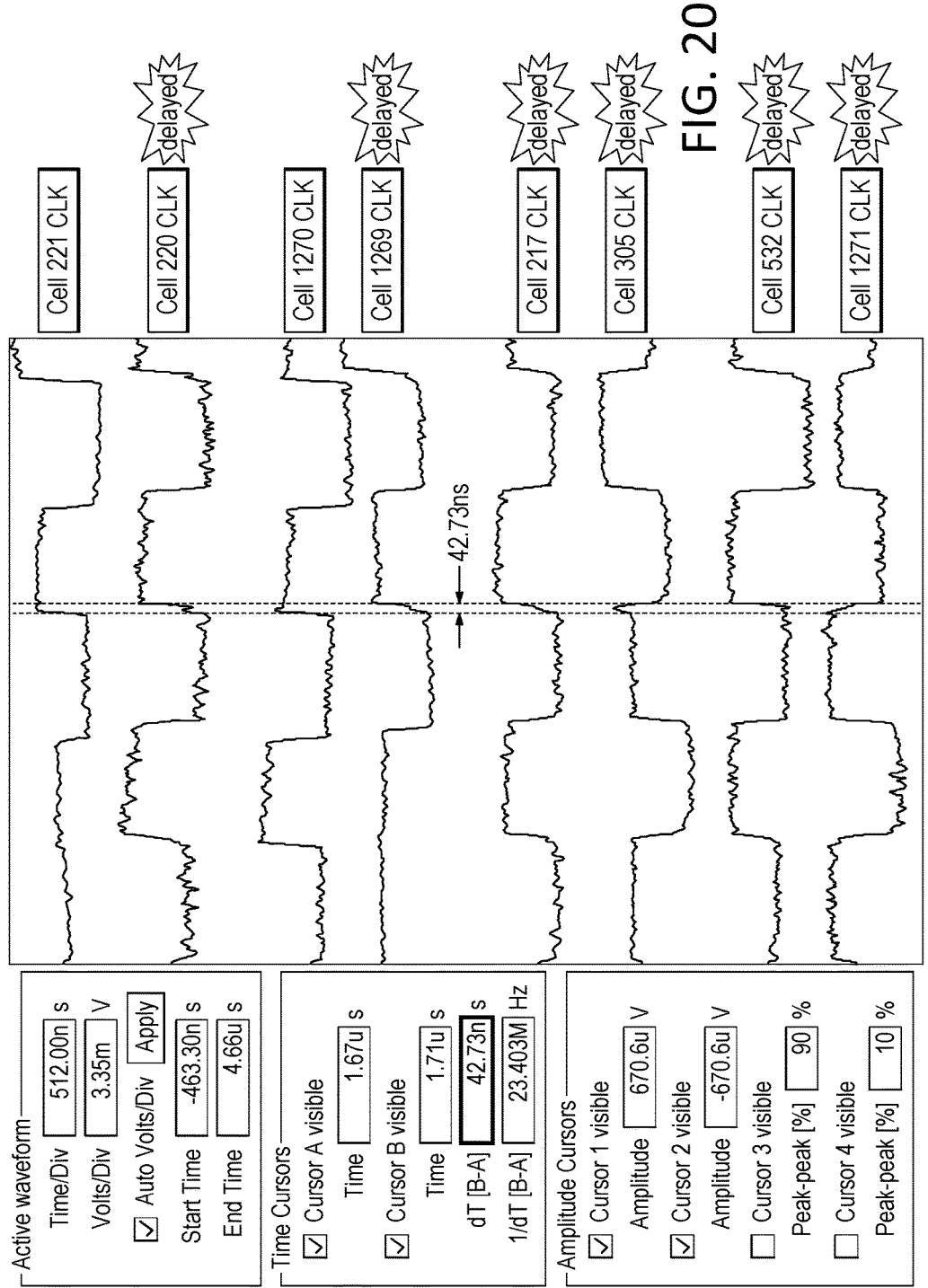
FIG. 20 is a laser probe screen display showing multiple clock signals, some of which are delayed, confirming the clock-skew between the delayed cells and associated shoot-thru cells.

FIG. 20 is a laser probe screen display showing multiple clock signals, some of which are delayed, confirming the clock-skew between the delayed cells and associated shoot-thru cells. This shows the clock inputs of the six cells identified in several of the figures discussed above and confirms the identified clock delays.

Figure 21:
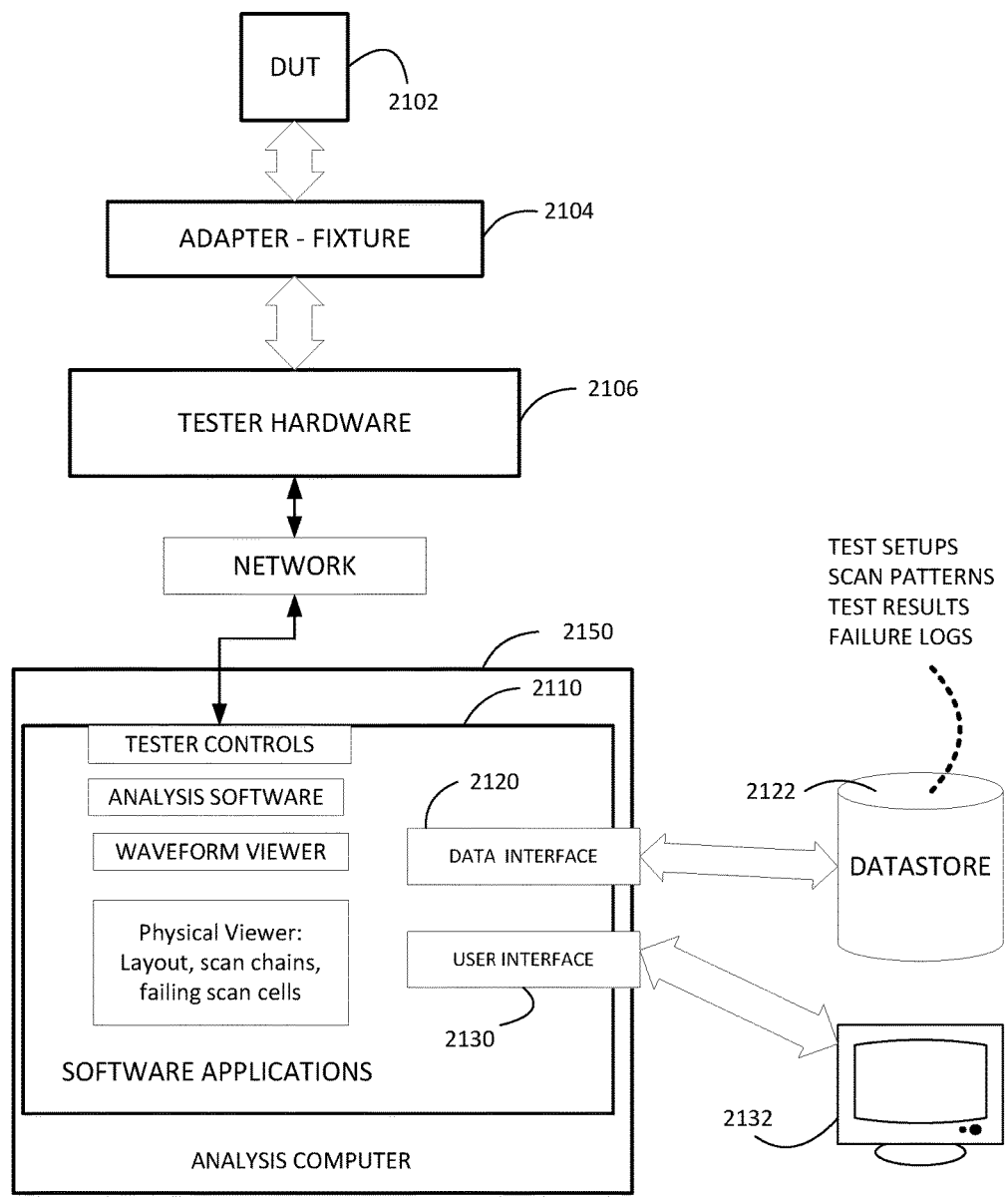
FIG. 21 is a simplified block diagram of one example of a system or environment suitable for implementing the teaching of the present disclosure.

FIG. 21 is a simplified block diagram of one example of a system or environment suitable for implementing the teaching of the present disclosure. In this example, an adapter or fixture 2104 may be provided for receiving and establishing electrical contact with a semiconductor integrated circuit device under test ("DUT") 2102. The fixture 2104 in turn is coupled to a tester hardware system 2106, which may contain various electronic circuits for testing the DUT. It may be arranged for testing scan chains as described herein, including without limitation applying test patterns to scan chain inputs, acquiring scan_out data, and the like.

An analysis computer 2150 may be provided, which may be any general-purpose computer. Various software tools are shown in box 2110. The software tools may include, without limitation, tester controls, a waveform viewer, and a physical viewer to display DUT layout, scan chains, failing scan cells, etc. The viewer may present data stored in a datastore 2122, via an interface 2120. The datastore may be hard drive of a computer system. In some embodiments, it may not be coupled to the tester system when performing analysis. The software tools may include software programs stored in the datastore or other memory, local or remote. In general, the various processes described above may be implemented in software, and the software executed on any suitable computer system 2150 or processor. A user interface 2132 such as a monitor may be used, coupled via a suitable interface 2130.

Hardware and Associated Software

Most of the equipment discussed above comprises hardware and associated software. For example, the typical electronic device is likely to include one or more processors and software executable on those processors to carry out the operations described. We use the term software herein in its commonly understood sense to refer to programs or routines (subroutines, objects, plug-ins, etc.), as well as data, usable by a machine or processor. As is well known, computer programs generally comprise instructions that are stored in machine-readable or computer-readable storage media. Some embodiments of the present invention may include executable programs or instructions that are stored in machine-readable or computer-readable storage media, such as a digital memory. We do not imply that a "computer" in the conventional sense is required in any particular embodiment. For example, various processors, embedded or otherwise, may be used in equipment such as the components described herein.

Memory for storing software again is well known. In some embodiments, memory associated with a given processor may be stored in the same physical device as the processor ("on-board" memory); for example, RAM or FLASH memory disposed within an integrated circuit microprocessor or the like. In other examples, the memory comprises an independent device, such as an external disk drive, storage array, or portable FLASH key fob. In such cases, the memory becomes "associated" with the digital processor when the two are operatively coupled together, or in communication with each other, for example by an I/O port, network connection, etc. such that the processor can read a file stored on the memory. Associated memory may be "read only" by design (ROM) or by virtue of permission settings, or not. Other examples include but are not limited to WORM, EPROM, EEPROM, FLASH, etc. Those technologies often are implemented in solid state semiconductor devices. Other memories may comprise moving parts, such as a conventional rotating disk drive. All such memories are "machine readable" or "computer-readable" and may be used to store executable instructions for implementing the functions described herein.

A "software product" refers to a memory device in which a series of executable instructions are stored in a machine-readable form so that a suitable machine or processor, with appropriate access to the software product, can execute the instructions to carry out a process implemented by the instructions. Software products are sometimes used to distribute software. Any type of machine-readable memory, including without limitation those summarized above, may be used to make a software product. That said, it is also known that software can be distributed via electronic transmission ("download"), in which case there typically will be a corresponding software product at the transmitting end of the transmission, or the receiving end, or both.

It will be obvious to those having skill in the art that many changes may be made to the details of the above-described embodiments without departing from the underlying principles of the invention. We claim all modifications and variations coming within the spirit and scope of the following claims.

The invention claimed is:

1. A method for testing a scan chain of a semiconductor integrated circuit, the method comprising the steps of:
   determining whether a shoot-through condition exists in the scan chain, and a base shift amount resulting from the shoot-through condition using flush test patterns;
   determining a number of shoot-through cells in the scan chain using flush test patterns;
   confirming the number of shoot-through cells using reset test patterns;
   determining locations of shoot-through cells and locations of delayed cells associated with the shoot-through cells; and
   identify a defective clock net/buffer of the integrated circuit that drives the delayed cells that cause the identified shoot-through conditions in the scan chain.

2. The method of claim 1 wherein determining the number of shoot-through locations includes:
   determining a repeating pattern sequence based on the base shift amount;
   determine whether output is inverted from input, and if so, inverting next pattern beginning load/input values comparing; and
   comparing flush test ending actual values to next test/pattern beginning load values (taking inversions into account), to determine the exact number of shoot-thru scan cell locations.

3. The method of claim 1 wherein determining the locations of shoot-through cells includes:
   (a) applying reset pattern analysis to determine one or more candidate ranges, each candidate range each extending from a corresponding initial candidate shoot-through cell, backwards in the scan chain, so as to include all cells with the same expected value as the initial candidate, the candidate ranges together defining a first set of potential shoot-through locations;
   (b) applying physical clock skew analysis to identify scan cells that have a potential for clock skew where adjacent cells of the scan chain are on different physical clock branches or nets, the scan cells identified by the physical clock skew analysis defining a second set of potential shoot-through locations; and
   (c) determining a final set of shoot-through candidates as an intersection of the first and second sets of potential shoot-through locations.

4. The method of claim 1 wherein identifying a defective clock net/buffer includes:
   locating the final set of shoot-through candidates on a clock tree of the integrated circuit;
   identifying clock branches that drive the corresponding "delayed cells" that follow the shoot-through candidate locations; and
   determining a defective clock net/buffer by traversing the clock tree from a lowest level (stage 1) clock net of a "delayed" cell candidate, upwards through the clock stages, until all the identified clock branches that contain "delayed" scan cells are included and only branches that contain "delayed" scan cells are included.

* * * * *